United States Patent
Hansen et al.

(10) Patent No.: US 7,492,217 B2
(45) Date of Patent: Feb. 17, 2009

(54) ON-THE-FLY INTRODUCTION OF INTER-CHANNEL DELAY IN A PULSE-WIDTH-MODULATION AMPLIFIER

(75) Inventors: Thomas Holm Hansen, Værløse (DK); Anker Bjørn-Josefsen, Lynge (DK); Lars Risbo, Copenhagen (DK); Douglas A. Roberson, Rockwall, TX (US)

(73) Assignee: Texas Instruments Incorporated, Dallas, TX (US)

( * ) Notice: Subject to any disclaimer, the term of this patent is extended or adjusted under 35 U.S.C. 154(b) by 485 days.

(21) Appl. No.: 10/988,268

(22) Filed: Nov. 12, 2004

(65) Prior Publication Data

US 2006/0103458 A1    May 18, 2006

(51) Int. Cl.
*H03F 3/38* (2006.01)
(52) U.S. Cl. .................. 330/10; 381/71.1; 381/94.5
(58) Field of Classification Search .............. 330/10; 381/71.1, 94.5
See application file for complete search history.

(56) References Cited

U.S. PATENT DOCUMENTS 5,982,231 A  * 11/1999 Nalbant .................... 330/10
6,373,336 B1    4/2002 Anderskouv et al.
6,720,825 B2    4/2004 Hansen et al.
2002/0060605 A1   5/2002 Kowkutla et al.
2004/0017854 A1   1/2004 Hansen et al.

* cited by examiner

*Primary Examiner*—Michael B Shingleton
(74) *Attorney, Agent, or Firm*—Warren J. Franz; Frederick J. Telecky, Jr.; Wade J. Brady, III

(57) ABSTRACT

A multiple-channel audio processor (10) and an associated plurality of power stages (22) in an audio system are disclosed. The audio processor (10) includes a plurality of audio amplifier channels (22), each of which includes a pulse-code-modulation (PCM) to pulse-width-modulation (PWM) conversion function (25), which generates PWM signals for application to the plurality of power stages (22). The audio amplifier channels (20) each also include an interchannel delay function (28) for delaying the PWM edges relative to other channels (20), for reducing noise. The audio amplifier channels (20) each also include delay adjust circuitry (32) for gradually increasing and decreasing the interchannel delay of the channel (20) on startup and shutdown. This permits a single control terminal (VALID) at the processor to globally enable and disable all of the power stages (22).

33 Claims, 21 Drawing Sheets

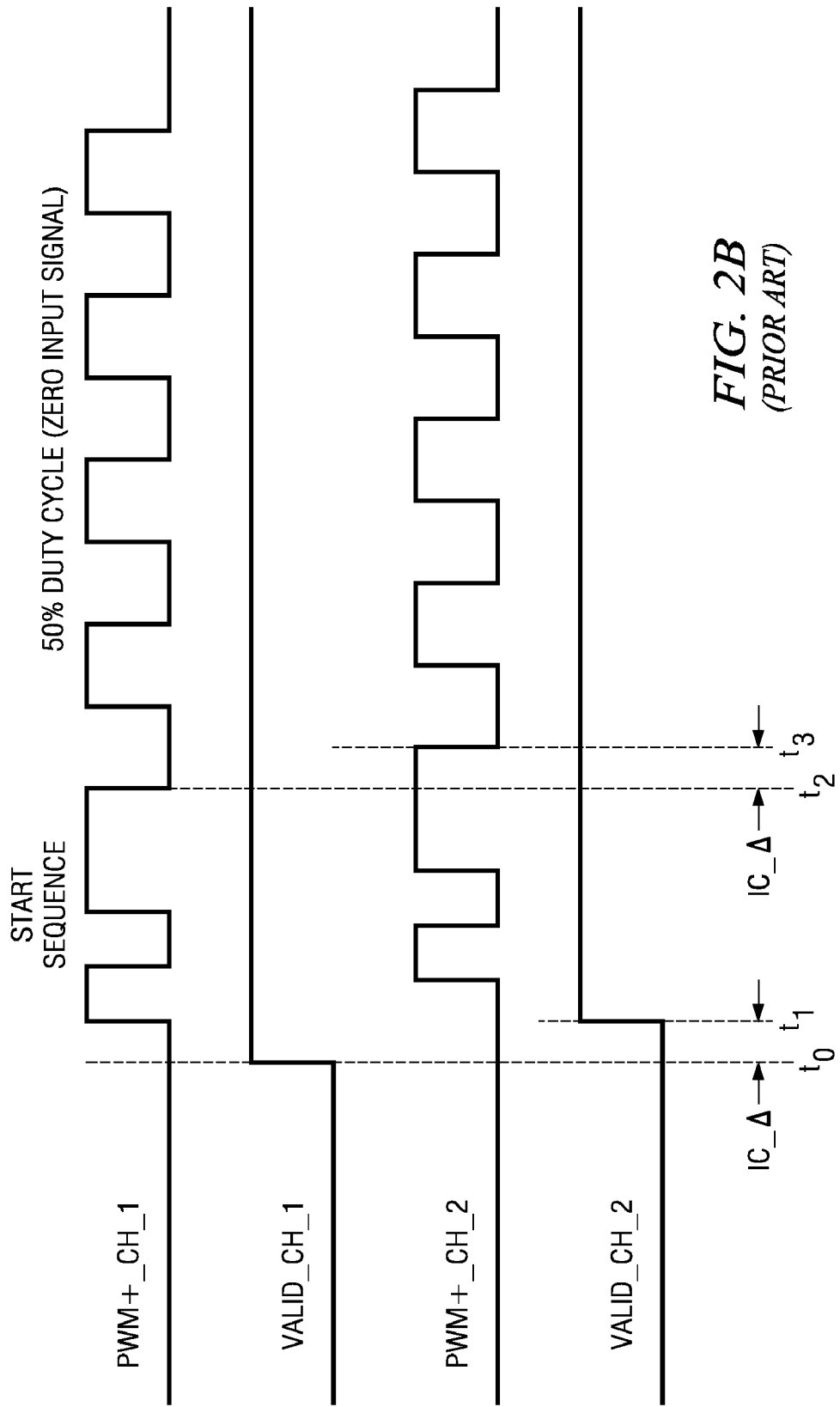

ON-THE-FLY INTRODUCTION OF INTER-CHANNEL DELAY IN A PULSE-WIDTH-MODULATION AMPLIFIER

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of audio amplifiers, and is more specifically directed to digital pulse-coded-modulation to pulse-width-modulation type class D audio power amplifiers.

In recent years, digital signal processing techniques have become prevalent in many electronic systems. The fidelity provided by digital techniques has increased dramatically with the switching speed of digital circuits. In audio applications, the sampling rates of modern digital signal processing are sufficiently fast that digital techniques have become widely accepted for audio electronic applications.

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, as well as in small form factor systems such as flat-panel LCD, plasma televisions, and DVD receivers. In addition, the ability to realize the audio output amplifier in CMOS enables integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

FIG. 1 illustrates the architecture of a conventional class D audio amplifier, specifically a so-called "class AD" audio amplifier with a bridged load, for a single channel (i.e., typically, one of multiple channels in the system). In the example of FIG. 1, an input digital audio signal is received on lines DIN by digital audio processing function 15. Typically, this digital audio signal is in the form of a twenty-four bit pulse-code-modulated (PCM) signal at a sample rate that typically ranges from 44 kHz to 192 kHz, depending on the audio source.

Digital audio processing function 15 applies the appropriate signal processing to the digital audio signal according to the functions of the system. This signal processing can include parametric speaker equalization or "voicing", implementation of graphic equalizer presets, treble and bass adjustment, precision soft volume control on the audio signal being processed for its channel. Other digital functions that can be performed by digital audio processing function 15 include loudness compensation to boost the bass frequencies when the output for the channel is low, dynamic range compression, background noise floor compensation or noise squelch, center or sub-woofer channel synthesis, programmable dither, peak limiting and clipping, and other digital filter processing. These functions are typically performed by the application of biquad, or second-order IIR, digital filters in a cascade arrangement.

According to this conventional architecture, as is typically in conventional digital audio systems, the PCM input signal is converted to a pulse-width-modulated (PWM) signal so that speaker SPKR is driven by a class D output amplifier. In order to achieve "CD" quality sound while keeping the PWM clock rate reasonable (200 MHz or less), however, a fully digital implementation of the PWM conversion includes interpolation function 17, which oversamples the processed PCM input signal at a rate that is much higher than the input sample rate; as known in the art, this oversampling reduces total harmonic distortion, and maintains harmonics that have significant amplitude outside of the audio band. In addition, noise shaping and digital non-linear correction function 19 processes the oversampled data stream from interpolation function 17. As known in the art, spectral noise-shaping is typically implemented by way of a sigma-delta modulator, resulting in quantization noise that is high-pass shaped to minimize the effects of quantization noise in audible frequencies. Digital non-linear correction, for example by way of Hammerstein modeling and correction that effectively includes simple power expansion of the input signal followed by linear and time-invariant digital filters, effectively compensates for distortion that otherwise is generated in the conversion of variable-amplitude, fixed-duration, PCM signals into fixed-amplitude, variable-duration, PWM signals.

In this conventional architecture of FIG. 1, the output of noise shaping and digital non-linear correction function 19 is an eight-bit digital signal, sampled at a frequency that is on the order of eight times the input sampling frequency (e.g., eight times the input sampling frequency of 48 kHz, or 384 kHz). As shown in FIG. 1b, the timing control is effected in this system by clock circuitry 13, which typically includes a frequency multiplier applied to a crystal oscillator clock signal, in combination with a digital phase-locked loop (PLL). PCM to PWM conversion function 21 generates PWM signals corresponding to the processed audio signal, in the conventional manner.

PCM to PWM conversion function 21 in this conventional class D audio amplifier is preferably implemented by digital circuitry that digitally calculates the times at which rising and falling edges of the PWM output signals are to be issued. In this manner, the reference triangle waveform may simply be a high-speed clock signal. The digital circuitry can simply receive the input PCM signal on line $PCM_{13}$ in, and digitally calculate the edges of the differential PWM pulses, including the desired filtering. Conventional high-speed digital signal processing circuitry is capable of carrying out these calculations sufficiently rapidly for driving digital audio output PWM signals, as known in the art.

In this conventional audio implementation, audio speaker SPKR is the load, and is bridged between pairs of output transistors 7A, 7C; 7B, 7D, in a class "AD" amplifier arrangement so that a zero input PCM signal will produce a 50% duty cycle output drive across load SPKR. This class AD arrangement is effected by transistors 7A, 7D being turned on while transistors 7B, 7C are off, so that current flows from left-to-right through load SPKR in one half-cycle, and so that transistors 7B, 7C are on while transistors 7A, 7D are off in the other half-cycle, during which current flows from right-to-left through load SPKR. In this arrangement, the common mode voltage across the bridged load SPKR is zero volts. LC filters 23P, 23M may be provided between the H-bridge of 7A, 7C; 7B, 7D and load SPKR.

By way of further background, other class D amplifier arrangements are also known in the art. One such arrangement is referred to as the class "BD" amplifier, by way of analogy to class B analog amplifiers. In the class BD amplifier, the two halves of the H-bridge are driven by separate modulators. As a result, there are three possible drive states across the bridged load: full positive polarity, full negative polarity, and zero volts. As a result, for zero input signal, no output PWM signals appear at all (i.e., there is zero output, or the PWM output is at a "zero" state).

Class D amplifiers have become attractive for audio applications, especially as the desired output power levels have increased over recent years. The efficiency of class D amplifiers in driving loudspeakers can be higher than 90%, which is much higher than the efficiency provided by conventional analog audio amplifiers. Among other benefits of this improved efficiency, the heat that is dissipated in the drive circuitry is much reduced, and thus the amplifier heat sinks can be much smaller (and thereby lighter). Class D audio amplifiers have thus become quite popular for portable and automotive audio systems.

By way of further background, the technique of providing inter-channel delay among multiple audio channels driven by class D amplifiers to reduce noise interference is known in the art. Such a technique is described in U.S. Patent Application Publication US 2002/0060605 A1, which is commonly assigned herewith and incorporated herein by this reference. As described in that Publication, programmable inter-channel delay between audio channels (e.g., left and right channels in a stereo system) can reduce switching noise between the pulse-width-modulated outputs, reduce cross-talk among the multiple channels, and generally provide significant improvement in system performance. More specifically, the inter-channel delay described in this Publication temporally moves the switching times of one channel away from the switching times of other channels, thus reducing peak switching noise levels. And as described in that Publication, and also in U.S. Pat. No. 6,373,336 B1, which is also commonly assigned herewith, programmable delay can be inserted so that the pulse-width-modulated switching times of opposite sides of a full-bridged load within a single channel are not temporally aligned, which also reduces switching noise within a single audio channel.

By way of further background, a particular problem in class D audio amplifiers is presented by the transient events of muting and un-muting of the audio system. As is fundamental in the art, a steady-state square wave time-domain signal (corresponding to a 50% duty cycle PWM signal) transforms into the frequency domain as discrete frequency components at the fundamental "carrier" frequency and its harmonics. It has been observed that if the PWM signal is abruptly gated on or off or otherwise abruptly changes its duty cycle, however, significant energy is present in sidebands to the carrier frequency and its harmonics. And even if the fundamental frequency is relatively high, the abrupt gating on or off of the PWM signal can result in sidebands with significant energy that extend into audible frequencies, which manifest as audible "clicks" or "pops". In audio systems, this gating on and off of the PWM output occurs when the user mutes or unmutes the audio output, and at power-up and power-down, in which case the audible clicks and pops are very undesirable.

Known techniques for reducing clicks and pops in analog audio amplifiers include smoothing the change in biasing, for example at power-up. However, these smooth biasing changes cannot be directly applied in class D amplifiers, because these amplifiers operate by way of PWM switching of the output transistors. According to another conventional approach, clicks and pops are reduced by introducing a switch or relay that disconnects the load during mode changes, thus eliminating transients from appearing at the load; however, the insertion and control of such a switch or relay has proven to be cost-prohibitive, especially in modern systems.

Considering that class D audio amplifiers effectively operate in the digital realm, and also considering that many sources of audio input signals are also digital in nature (e.g., compact discs, MP3 and other digitally compressed music files, satellite radio), many modern audio systems are fully digital, in that they receive digital input signals and produce digital, PWM, class D amplifier output. In these fully digital systems, digital signal processing techniques for suppressing clicks and pops are known. Examples of these digital techniques are described in U.S. Pat. No. 6,720,825 and in U.S. Patent Application Publication No. US 2004/0017854, assigned to Texas Instruments Incorporated and incorporated herein by this reference.

Referring now to FIGS. 2a and 2b, the architecture of a conventional multiple channel digital audio system, and its operation in implementing both conventional suppression of clicks and pops and also conventional inter-channel delay, will now be described. As shown in FIG. 2a, multi-channel digital signal processing function 15n receives the input audio signals corresponding to n audio channels, and performs the digital signal processing described above relative to function 15 of FIG. 1. Digital signal processing function 15n presents n output signals, in PCM form, to each of n PWM channels $25_1$ through $25_n$. PWM channels 25 perform the PCM-to-PWM conversion, interpolation filtering, and the like described above relative to FIGS. 1a and 1b, and generate corresponding differential pulse-width-modulated signals on output lines PWM+, PWM−, which are forwarded to a corresponding power stage 27. Each of power stages $27_1$ through $27_n$ include the H-bridge transistors 7A through 7D, as described above relative to FIG. 1, which drive their respective loads SPKR_1 through SPKR_n. In addition, each of PWM channels $25_1$ through $25_n$ generate a control signal on line VALID_CH_1 through VALID_CH_n to its respective power stage $27_1$ through $27_n$. The level present on each line VALID indicates (when active) that its power stage 27 is to respond to the PWM signals on its associated lines PWM+, PWM− and drive load SPKR accordingly; an inactive level on line VALID causes its associated power stage 27 to place its output in an inactive state, regardless of the signals on lines PWM+, PWM−. This inactive state can be a high-impedance condition, in which all switches are turned off to float load SPKR, or can be a short-circuit state in which both terminals to load SPKR are at ground.

In this conventional arrangement, power stages $27_1$ through $27_n$ are realized by separate integrated circuits from integrated circuit 26 that implements PWM channels $25_1$ through $25_n$ (and digital signal processing function 15). An example of a conventional class D amplifier power stage integrated circuit is the TAS5111 Digital Amplifier Power Stage integrated circuit available from Texas Instruments Incorporated, which is designed to drive a single bridged 4 ohm speaker in response to a differential PWM signal for a single channel. A conventional example of integrated circuit 26 that includes digital signal processing function 15n and multiple PWM channels 25 is the TAS5036 Six Channel Digital Audio PWM Processor, also available from Texas Instruments Incorporated. As evident from FIG. 2a, three conductors per audio channel are required, two conductors (PWM+, PWM−) for the PWM signal and one conductor (VALID) for the control or enable signal.

FIG. 2b illustrates a sequence of operation of the system of FIG. 2a, in beginning operation from a muted condition. Prior to time $t_0$ in this example of FIG. 2b, all channels (i.e., both channels in this example) are inactive, as indicated by the low levels on lines VALID_CH_1 and VALID_CH_2. In this example, the signals on lines PWM+ and PWM− for both of channels 1 and 2 are inactive. Only the signals on lines PWM+ are shown in FIG. 2b (by way of lines PWM+_CH_1 and PWM+_CH_2) for the sake of clarity, it being understood that the PWM signals on lines PWM− for each channel are complementary to those on lines PWM+. At time $t_1$, line VALID_CH_1 is taken to a high, active, level, and PWM channel $25_1$ begins issuing a reduced click and pop start sequence on its lines PWM+, PWM−. The specific sequence applied to lines PWM+, PWM− at this time are designed to cancel out transients in audible frequencies that result from the starting of the PWM output. The specific pulses in the start sequence can be selected in the manner described in U.S. Pat. No. 6,720,825 B1, incorporated herein by reference.

In this conventional system, inter-channel delay is provided between the multiple channels in this system, to reduce switching noise between the pulse-width-modulated outputs, reduce cross-talk among the multiple channels, and generally provide significant improvement in system performance, as described in U.S. Patent Publication No. US 2002/0060605 A1 and U.S. Pat. No. 6,373,336 B1, both also incorporated herein by reference. This conventional inter-channel delay is enforced not only for PWM signals but also in the issuing of an active level on the VALID line, as shown in FIG. 2b. This is because the effective signal that is reproduced at the power stage output is a function of the signals on both of the PWM and VALID lines for a single channel. Consequently, both PWM lines and the VALID signal must be shifted in time, by the same delay time, in order to produce a low click and pop start. Accordingly, at time $t_1$, line VALID_CH_2 is taken to an active level to enable power stage $27_2$, following the selected inter-channel delay IC_Δ. The click and pop reducing start sequence then initiates for channel 2, as shown on line PWM+_CH_2; this start sequence corresponds to that applied to channel 1, but is also delayed by the inter-channel delay IC_Δ.

At the end of the start sequence for channel 1, at time $t_2$, PWM channel $25_1$ begins driving lines PWM+, PWM− (shown as line PWM+_CH_1 in FIG. 2b) with an audio signal. For purposes of this description, the audio signal shown in FIG. 2b is a zero level signal, which amounts to a 50% duty cycle on lines PWM+, PWM− because of the class AD arrangement in this example. And after the elapse of the inter-channel delay IC_Δ, at time $t_3$, PWM channel $25_2$ begins driving its PWM signals on lines PWM+, PWM− (shown as line PWM+_CH_2 in FIG. 2b).

According to this conventional approach, therefore, both of the beneficial techniques of inter-channel delay and reduced click and pop start sequences are applied in the multi-channel system. However, as evident from FIG. 2a, this approach requires integrated circuit 26 to have a VALID pin and conductor dedicated to each of its output channels. For example, six VALID pins (and conductor lines) are required for a six-channel audio signal processor. Especially with the continuing trend toward ever-smaller and less power-consumptive audio systems, this large number of pins and conductors is a significant constraint on the ability to reduce the size and form factor of the integrated circuits. The number of pins is especially limited in high power packages, because of the need to safely conduct heat from the packaged integrated circuit. And high pin counts also complicate the layout and construction of the system boards for the audio systems.

BRIEF SUMMARY OF THE INVENTION

It is therefore an object of this invention to provide a class D audio amplifier system in which noise is reduced by inter-channel delay and in which clicks and pops from muting and unmuting are also reduced.

It is a further object of this invention to provide such a system in which the number of terminals of and conductors between pulse-width-modulator and power stage devices is minimized while still providing these features.

Other objects and advantages of this invention will be apparent to those of ordinary skill in the art having reference to the following specification together with its drawings.

The present invention may be implemented into a multiple-channel class D audio amplifier system in which the pulse-width-modulators for each of the multiple channels simultaneously start with a low-click start sequence upon the cessation of a muting event. After the low-click start sequences complete, inter-channel delays are applied to the pulse-width-modulated pulses from each of the channels, in a predetermined arrangement relative to one another, and with delay increasing in selected increments. A similar inter-channel delay sequence is applied, in reverse, upon muting of the audio system.

BRIEF DESCRIPTION OF THE SEVERAL VIEWS OF THE DRAWING

FIG. 2b is a timing diagram illustrating the operation of the conventional system of FIG. 2a in making a transition from a muted state to generating audio output.

DETAILED DESCRIPTION OF THE INVENTION

The present invention will be described in connection with its preferred embodiment, namely as implemented into a multiple-channel audio system, such as a home theater sound system, as it is contemplated that this invention is especially beneficial in such an application. However, it is also contemplated that this invention will be beneficial in many other applications in which class D amplifiers, or pulse-width-modulators, are applicable. Accordingly, it is to be understood that the following description is provided by way of example only, and is not intended to limit the true scope of this invention as claimed.

Figure 3:
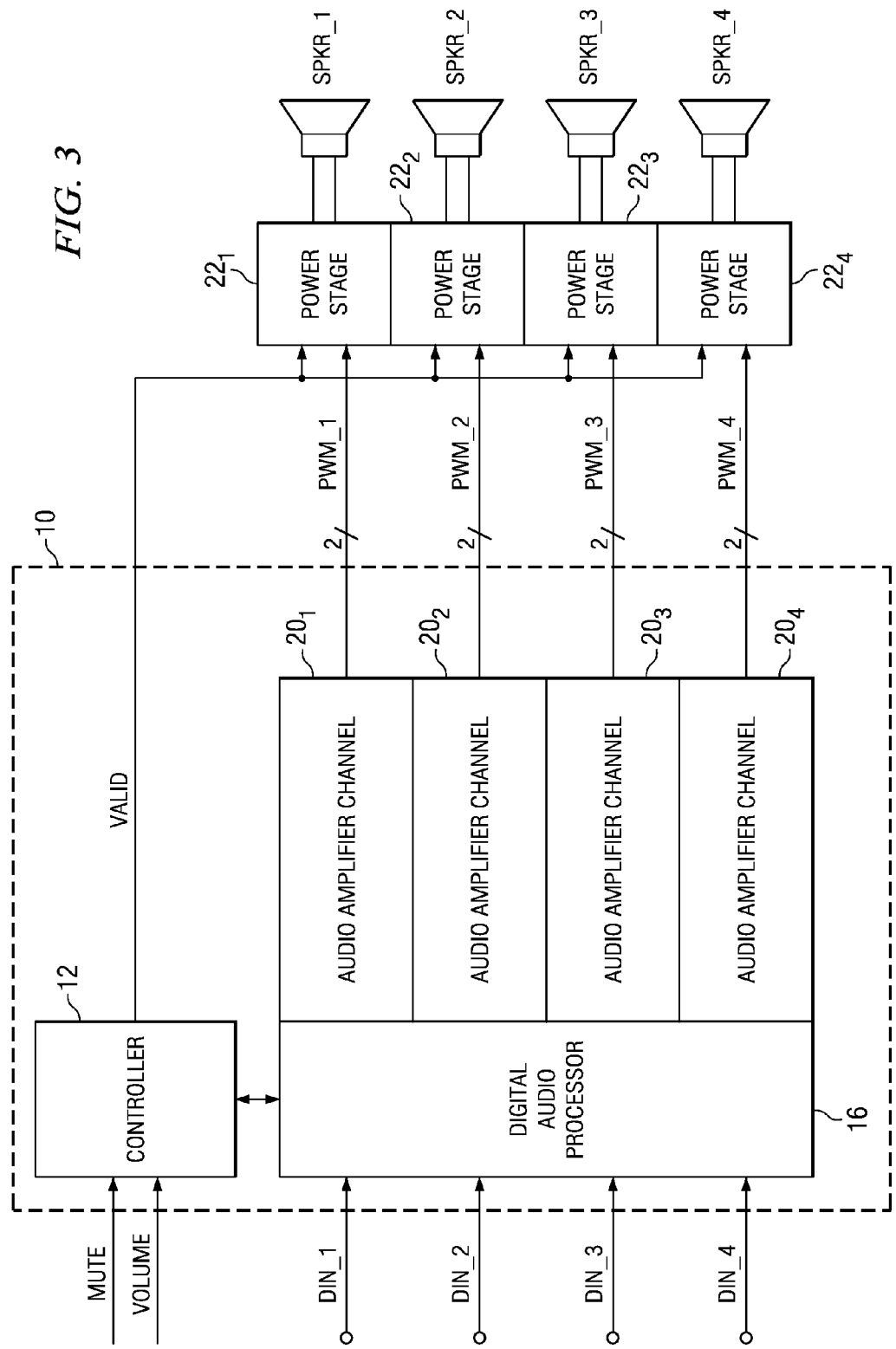
FIG. 3 is an electrical diagram, in block form, of a multiple-channel digital audio amplifier system, constructed according to the preferred embodiment of the invention.

FIG. 3 illustrates the construction of a digital audio amplifier system constructed according to the preferred embodiment of the invention. In this example, this system is capable of driving four output audio channels from four separate digital inputs. It is, of course, contemplated that the system may drive more or fewer channels, depending upon the system requirements and specifications.

According to this example, the audio system of FIG. 3 includes audio PWM processor 10, which is preferably implemented as a single integrated circuit for performing much of the digital domain audio processing for the multiple audio channels. Processor 10 may, alternatively, be implemented by multiple integrated circuits, if appropriate for a particular application.

Within processor 10, digital audio processing function 16 has multiple inputs that are coupled to one or more audio sources, and that receives four digital input signals DIN_1 through DIN_4 respectively. Digital audio processing function 16 includes conventional circuitry for performing the conventional functions of parametric speaker equalization or "voicing", implementation of graphic equalizer presets, treble and bass adjustment, precision soft volume control on the audio signal being processed for its channel. Other digital functions that can be performed by digital audio processing function 16 include loudness compensation to boost the bass frequencies when the output for the channel is low, dynamic range compression, background noise floor compensation or noise squelch, center or sub-woofer channel synthesis, programmable dither, peak limiting and clipping, and other digital filter processing. These functions are typically performed by the application of biquad, or second-order IIR, digital filters in a cascade arrangement.

Audio amplifier channels $20_1$ through $20_4$ drive class D pulse-width-modulated (PWM) output signals PWM_1 through PWM_4, respectively, according to the processed digital audio input signals for their respective channels, as processed by digital audio processor 16. These PWM output signals PWM_1 through PWM_4 are applied to power stage circuits $22_1$ through $22_4$, respectively, which in turn drive respective ones of speakers SPKR_1 through SPKR_4. In this embodiment of the invention, speakers SPKR_1 through SPKR_4_ are bridged loads to audio amplifier channels $20_1$ through $20_4$, and as such output signals PWM_1 through PWM_4 include two signals, which power stages 22 convert into two half-bridge outputs. The combination of the half-bridges applying the output to speakers SPKR_1 through SPKR_4 is often referred to as an "H-bridge", as known in the art. In this specific example, as will become apparent from the following description, audio amplifier channels $20_1$ through $20_4$ are constructed to have class AD output drive characteristics, in which case the output signals PWM_1 through PWM_4 each include a pair of lines (PWM+, PWM−) that communicate complementary output signals from the two half-bridge outputs.

Various control circuitry is also included within processor 10 according to this embodiment of the invention. Controller 12 provides the conventional control functions for processor 10, such functions, including overvoltage and undervoltage detection and protection, detection and control related to other faults in the operation of processor 10, clock circuitry for generating the various clock signals used by processor 10 and, according to this invention, receipt and processing of mute signal MUTE, and the receipt of user-programmable values for configuring and controlling processor 10. Also, according to this embodiment of the invention, digital audio processor 16 is controlled by clock and control signals from controller 12, and from other control functions within processor 10 (not shown).

Controller 12 is also operable also to generate a global control signal on line VALID, which is forwarded in common to each of power stages 22 in this embodiment of the invention. As will be apparent from the following description, the provision of a single common VALID control line for all of power stages 22, rather than a single control line for each channel, is a significant benefit of this invention.

Figure 4A:
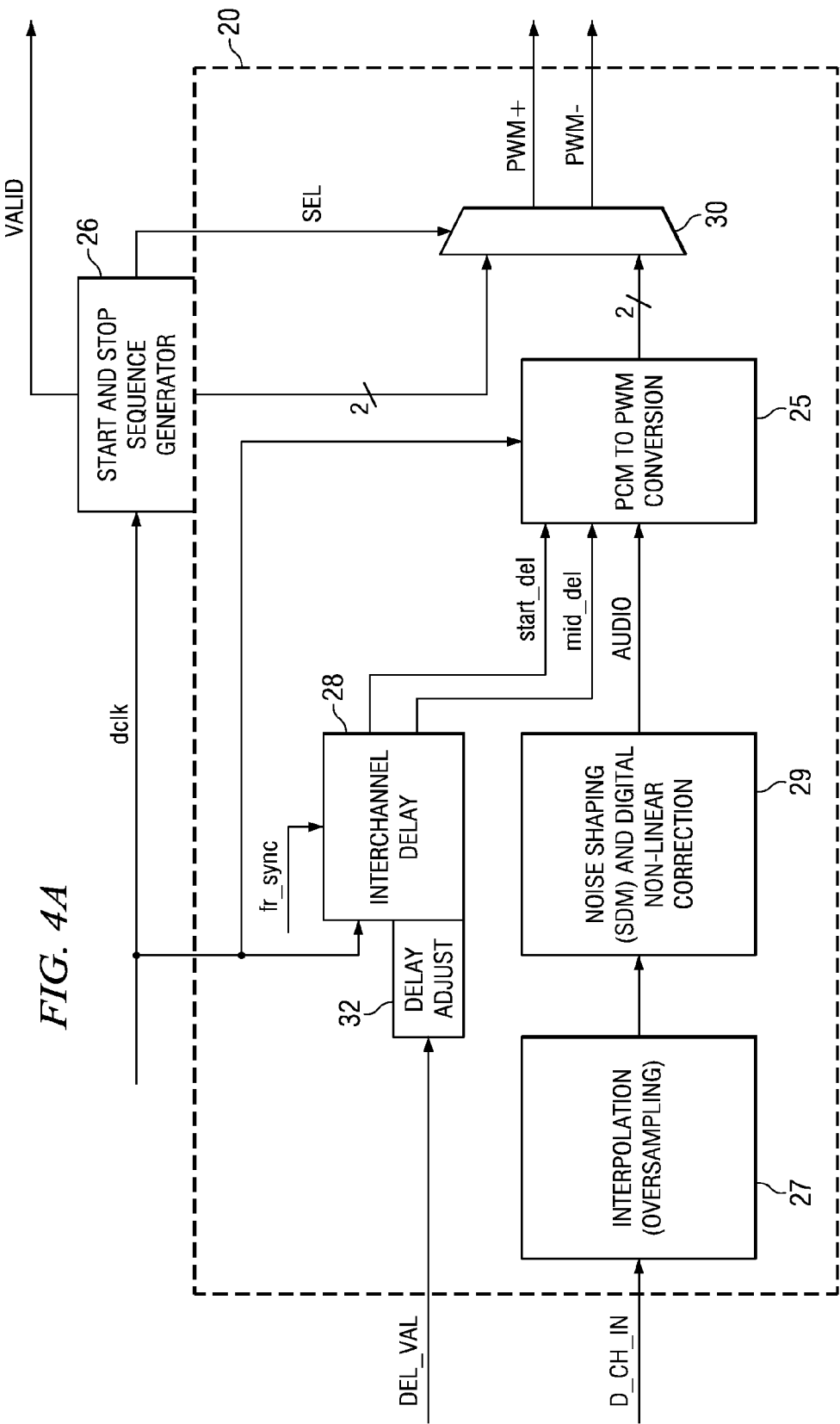
FIG. 4a is an electrical diagram, in block form, of an audio channel of the digital audio amplifier system of FIG. 3, constructed according to the preferred embodiment of the invention.

Referring now to FIG. 4a, the construction of one of audio amplifier channels 20 will now be described in further detail. It is of course contemplated that each of audio amplifier channels $20_1$ through $20_4$ in system 10 will be constructed identically as one another, corresponding to the construction of channel 20 as shown in FIG. 3. Of course, the particular construction of one or more of channels 20 may vary from that shown in FIG. 3, if appropriate for a particular application.

Digital input signal D_CH_IN is a digital sample stream produced by digital audio processor 16 (FIG. 3), and as such corresponds to the digital audio signal to be output by channel 20, as filtered and processed by digital audio processor 16. Preferably, the input digital signal D_CH_IN is a pulse-code modulated signal, and may have both positive and negative values. This digital input signal D_CH_IN is received by interpolation filter 27 in audio amplifier channel 20 as shown in FIG. 4a. While it is contemplated that audio amplifier channel 20 is implemented as a fully digital PCM signal, this signal may alternatively be in the form of a differential or single-ended analog signal, or a digital signal in another format. It is contemplated that those skilled in the art will be readily able to construct audio amplifier channels 20 to respond to the input signal in a manner according to its format (i.e., digital, differential analog, or single-ended analog), as desired. The generalized construction of channel 20 illustrated in FIG. 4a is intended to be applicable to either implementation.

Interpolation filter 27 effectively converts the sample rate of the input digital signal D_CH_IN to (or at least toward) the eventual PWM rate, which is significantly higher in frequency (e.g., by eight times) than the data rate of the input data stream. As known in the art, interpolation filter 27 accomplishes this oversampling function by digitally interpolating the PCM input signal (in this example by a ratio of 1:8), although other approaches and oversampling ratios may alternatively be used.

The oversampled input signal is then applied to noise-shaping and digital non-linear correction filter 29. In this preferred embodiment of the invention, the noise shaping applied by filter 29 involves a sigma-delta modulator (SDM), in which a feedback correction signal is subtracted from the input signal, and the resulting difference integrated and quantized; the feedback correction signal includes a measure of the quantization noise, which is spectrally shaped by a digital filter in the feedback loop to form the feedback correction signal. As a result, noise from the SDM quantization is moved into the higher frequency portion of the spectrum, preferably well above the audible range. The characteristic of the noise shaping may be as simple as a first order filter; preferably, higher order noise shaping in the SDM feedback loop is applied, for example as a fifth order filter. Non-linear correction is then applied by filter 29, for example by way of Hammerstein Modeling and Correction, as known in the art, to correct for non-linearity caused by the downstream pulse-width-modulation by applying an "anti-distortion" into the signal. This non-linear correction is preferably applied by applying a simple power expansion of the oversampled signal after noise shaping, followed by linear and time-invariant digital high-pass filtering. It is contemplated that those skilled in the art having reference to this specification will be readily capable of including the appropriate noise shaping and digital non-linear correction desired for a particular implementation and performance requirement. Of course, noise-shaping and digital non-linear correction filter 29 may include additional filtering or processing operations, or may otherwise be arranged to effect the desired characteristics. The PCM input signal, after processing by interpolation filter 27 and noise-shaping and digital non-linear correction filter 29 is then applied to PCM to PWM conversion function 25, on lines audio, as shown in FIG. 4a.

The detailed construction of PCM to PWM conversion function 25 will be described in further detail below relative to FIG. 6. In a higher level sense as shown in FIG. 4a, PCM to PWM conversion function 25 receives the digital audio signal on lines audio, along with a high speed PWM clock signal on line dclk. In this example, PCM to PWM conversion function 25 generates a pulse-width-modulated signal at its output, with a duty cycle that corresponds to and varies with the time-varying amplitude of the signal on lines audio, at a PWM frequency that corresponds to the high-speed clock on line dclk. The output signal from PCM to PWM conversion function 25 can be in various forms, depending upon the nature of the drive stage and its connection to load SPKR. In this example of a class AD output, PCM to PWM conversion function 25 generates a differential PWM signal at its output, with the two signal lines being logical complements of one another. The output of PCM to PWM conversion function 25 is applied to an input of multiplexer 30, in this example, the output of which drives the selected differential PWM signal on lines PWM+, PWM− to the corresponding power stage 22.

According to this embodiment of the invention, an inter-channel delay is provided in the PWM output signals from each of channels 20, relative to one another. Typically one of channels 20 serves as the reference channel (i.e., having no delay), and the others of channels 20 are assigned positive (retarding) and negative (advancing) delays relative to that reference channel. The inter-channel delays among channels 20 are typically specified by numbers of cycles of the high-speed PWM clock on line dclk. For example, the interchannel delays among channels may be ±8, ±16, and ±24 cycles of this high-speed clock signal.

Referring to FIG. 4a, the interchannel delay for channel 20 is implemented by interchannel delay function 28, which receives specified values of delay on lines DEL_VAL, for example from controller 12 via delay adjust circuit 32, and stores these values in registers within interchannel delay function 28. The construction and operation of delay adjust circuit 32 will be described in detail below; as will become apparent, delay adjust circuit 32 will control the instantaneous interchannel delay during transition periods into and out of muting. Interchannel delay function 28 also receives the high-speed clock signal on line dclk. A frame synchronization clock on line fr_sync is also applied to interchannel delay function 28, for example by controller 12. Interchannel delay function 28 issues control pulses on lines start_del and mid_del to PCM to PWM conversion function 25. These pulses on lines start_del and mid_del serve as delimiters for the beginning and midpoint of a pulse-width-modulated frame, where the frame corresponds to a fixed number of cycles (e.g., 512) of the high-speed clock that is to correspond to one cycle of the PWM signals on lines PWM+, PWM−. For the example of a 50% duty cycle PWM signal (corresponding to a zero input level for a class AD amplifier), line PWM+ will be at a high level for 256 cycles of the high-speed clock and at a low level for 256 cycles of the high-speed clock. The pulse on line start_del indicates the relationship of the rising and falling edges of the PWM signals relative to the "frame" of 512 clock cycles, for that channel 20.

Figure 4B:
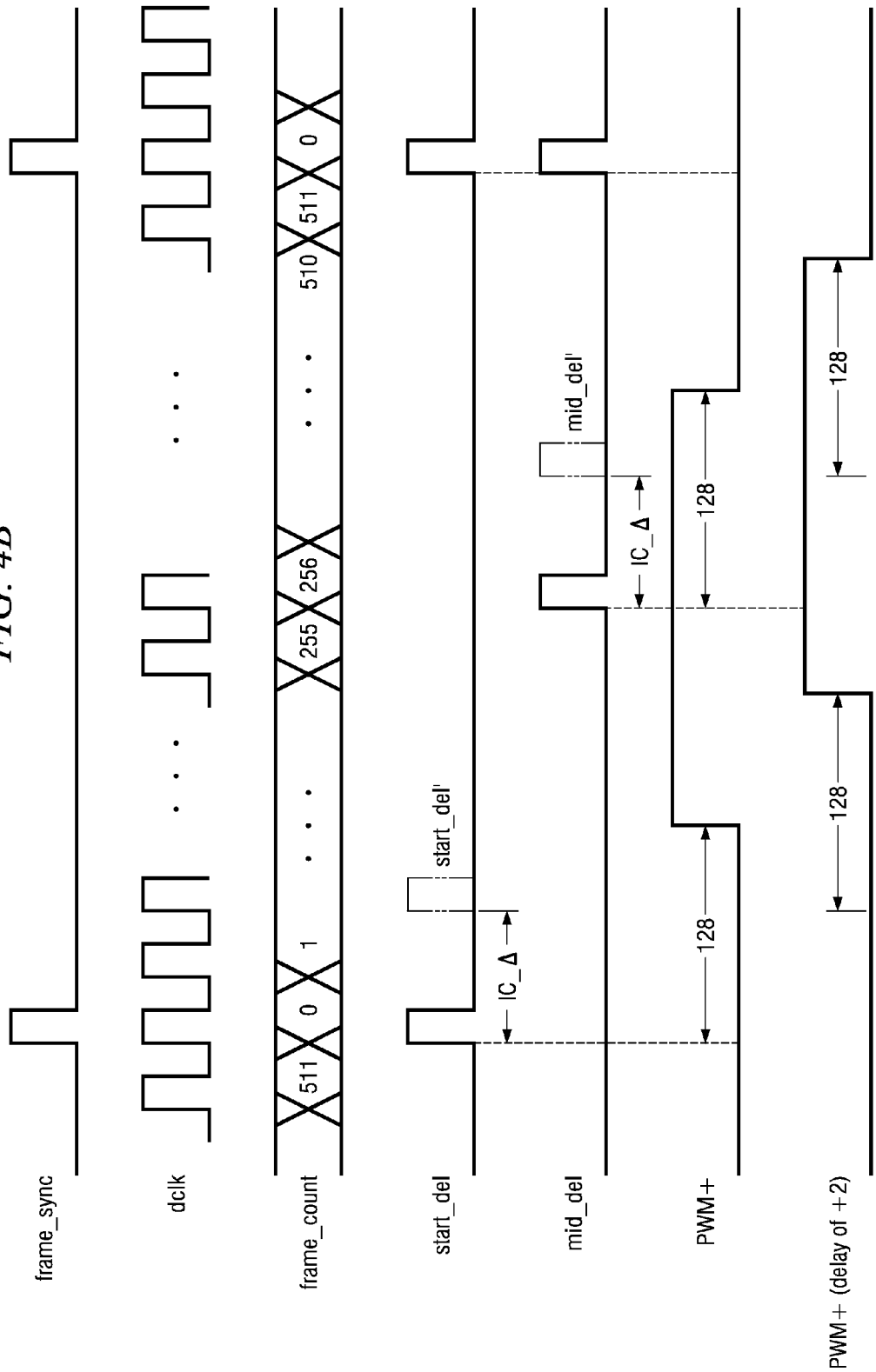
FIG. 4b is a timing diagram illustrating the steady-state operation of the audio channel of FIG. 4a according to the preferred embodiment of the invention.

FIG. 4b illustrates the steady-state operation of interchannel delay function 28 in this higher level architecture. For reference purposes, a frame synchronization clock fr_sync indicates, with a rising edge, the beginning of a PWM frame; in combination with clock fr_sync, a counter maintains a frame count, which is a value frame_count that counts the number of cycles of high-speed clock dclk within each frame. This frame counter need not be maintained within each channel 20, and in fact need not be present at all in processor 10, but is shown in FIG. 4b for the purpose of this description. As shown in FIG. 4b at successive rising edges of clock fr_sync, there are 512 cycles of high-speed clock dclk within each PWM frame in this example.

Using the rising edge of clock fr_sync as a reference, start delimiter signal start_del is generated by interchannel delay function 28, to indicate the beginning of a PWM frame to the corresponding PCM to PWM conversion function 25 in its corresponding channel. Similarly, interchannel delay function 28 issues mid-frame delimiter mid_del at the midpoint of each frame. For the instance of channel 20 with zero interchannel delay, interchannel delay function 28 issues its start delimiter signal start_del at the beginning of the frame as indicated by clock fr_sync, coincident with the frame counter value frame_count at zero. Similarly, in this zero interchannel delay case, interchannel delay function 28 issues its mid-frame delimiter signal mid_del in the high speed clock cycle corresponding to the frame count value frame_count of 256.

PCM to PWM conversion function 25, according to this preferred embodiment of the invention, issues its PWM pulses at a point within the PWM frame indicated by the start and mid-frame delimiter signals start_del, mid_del, respectively. For the example shown in FIG. 4b, in which the input audio signal is at a zero level so that the PWM signal will be at a 50% duty cycle, the rising edge of the PWM signal on line PWM+ is generated 128 dclk cycles following start delimiter signal start_del, and continues for 128 dclk cycles following mid-frame delimiter signal mid_del.

If an interchannel delay IC_Δ is applied by interchannel delay function 28, for its corresponding channel 20, the PWM output signal (line PWM+ in the example of FIG. 4b) will be delayed accordingly. FIG. 4b illustrates an example of an interchannel delay IC_Δ having a value of +1, corresponding to four dclk cycles delayed from the frame synchronization clock fr_sync. In this example, channel delay is communicated as an integer ranging from −32 to +31, with a resolution of 4 cycles of high-speed clock dclk and, for a PWM frame of 512 dclk cycles, thus deriving a range of delays of plus or minus one-fourth of a PWM frame. Optionally, an offset mechanism is also provided so that the range of delays (i.e., plus or minus one-fourth PWM frame) may be centered at any selected point within the PWM frame. Referring to the example of FIG. 4b, for the +1 delayed channel 20, interchannel delay function 28 will issue its start delimiter signal start_del' four dclk cycles after the start delimiter signal start_del is issued in the channel 20 that is the reference (i.e., the undelayed channel). Similarly, this interchannel delay IC_Δ, having a value of +1 cycle in this example, also delays the mid-frame delimiter signal by four cycles of high-speed clock dclk. The resulting pulse-width-modulated signal thus has a rising edge that occurs 128 dclk cycles after the delayed start delimiter signal start_del', and a failing edge that occurs 128 dclk cycles after the delayed mid-frame delimiter signal mid_del'.

The operation of interchannel delay function 28 illustrated in FIG. 4b continues in the steady-state, with the actual duty cycle depending of course on the amplitude of the processed and filtered input digital PCM signal. In each case, however, PCM to PWM modulation function 25 calculates the number of clock cycles at which the rising and falling edges of the PWM output signals on lines PWM+, PWM− are to occur (the signals being logical complements in this class AD example), and generates these edges at the calculated times following the start and mid-frame delimiter signals start_del, mid_del, as delayed by the interchannel delay function 28 for its channel 20.

Referring back to FIG. 4a, however, processor 10 also includes start and stop sequence generator 26, preferably as a single instance for all channels 20, but alternatively as a separate circuit within each of multiple channels 20. According to this preferred embodiment of the invention, start and stop sequence generator 26 receives signals on line MUTE from controller 12, which indicates the times at which the power stages 22 (for all channels 20 in this embodiment of the invention, as shown in FIG. 3) are to be enabled to drive their corresponding loads SPKR. Start and stop sequence generator 26 is for generating initial pulses to the corresponding power stage 22 to compensate for audible clicks and pops upon start up (unmuting) or shut down (muting) of audible output. For example, upon controller 12 de-asserting line MUTE, start and stop sequence generator 26 generates its sequence of PWM pulses to channels 20, and also asserts the VALID signal. The output of start and stop sequence generator 26 is connected to a second input of multiplexer 30, and start and stop sequence generator 26 also produces a control signal on line SEL, applied to a control input of multiplexer 30, to control the selection performed by multiplexer 30.

Alternatively, the start and stop sequence may be generated by applying a sequence of digital PCM values corresponding to the desired sequence to the input of PCM to PWM conversion function 25. In this alternative approach, multiplexer 30 would be moved to the input of PCM to PWM conversion function 25, to select between the audio input signal from noise shaping and digital non-linear correction function 29 and the start and stop sequence values for application to PCM to PWM conversion 25. However, because the start and stop sequence pulses are not symmetric, this alternative approach would require further re-design of PCM to PWM conversion function 25.

Figure 5A:
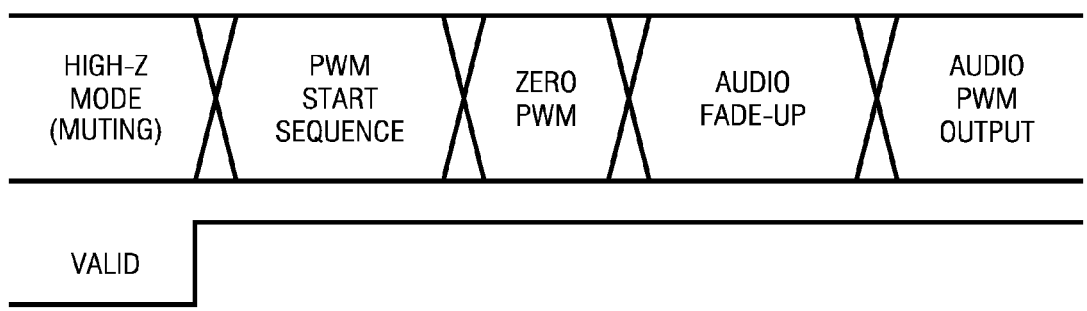
FIGS. 5a and 5b are timing diagrams illustrating the startup and shutdown, or unmuting and muting, sequences, respectively, of the audio channels in the system of FIG. 3 according to the preferred embodiment of the invention.

FIG. 5a illustrates the generalized fining of the operation of channel 20, from a muted condition to active full power audio. In this example, the muted condition is effected by power stage 22 being in a high-impedance ("high-Z") state, as shown in FIG. 5a. The transition from this muted state begins with a transition on line VALID from an inactive level to an active level. Start and stop sequence generator 26 will control multiplexer 30, via a signal on line SEL, to select the output of start and stop sequence generator 26 for application to power stage 22 for a selected time duration, during which start and stop sequence generator 26 will also generate its PWM signals in a start sequence for application to power stage 22. The time duration following a transition of line VALID may be a certain number of cycles of high-speed clock dclk, may be a certain number of edges of the PWM signals in the start sequence, or may be controlled in another fashion as desired. Following the transition period, start and stop sequence generator 26 changes the state of the control signal on line SEL, so that multiplexer 30 now selects the output of PCM to PWM conversion function 25 for application to power stage 22. As shown in FIG. 5a, the preferred sequence for completing the unmuting operation begins with PCM to PWM conversion function 25 issuing zero input level output signals (i.e., 50% duty cycle PWM output for this class AD example) for a selected duration, following which PCM to PWM conversion function 25 fades up to its full PWM output level (depending, of course, on the volume level selected by the user).

Figure 5B:
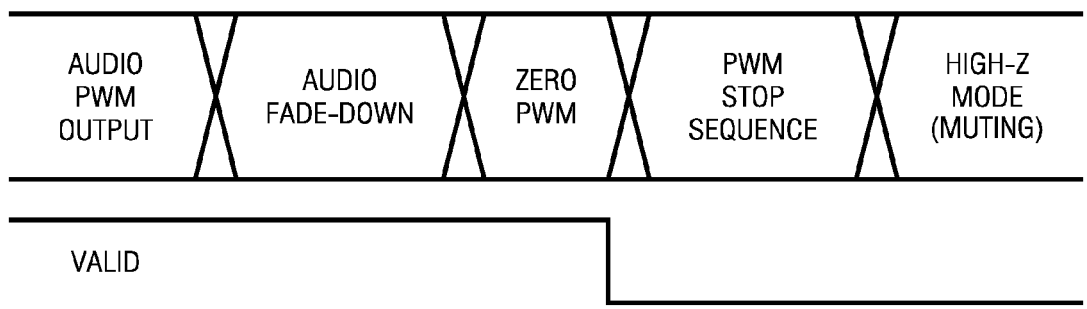

Conversely, as shown in FIG. 5b, transition from full power output to muting begins with a fade-down applied by PCM to PWM conversion function 25, under the control of controller 12, until the zero input level state (50% duty cycle in class AD) outputs are produced. Controller 12 issues an asserted signal on line MUTE to start and stop sequence generator 26, indicating the muting event, in response to which start and stop sequence generator 26 again issues a control signal on line SEL to multiplexer 30 to cause selection of the output of start and stop sequence generator 26 for application to power stage 22, and for a selected duration. During this time, start and stop sequence generator 26 produces a sequence of pulses that are designed to compensate for clicks and pops due to the sudden transition to muting (the "PWM stop sequence" of FIG. 5b). These pulses are thus forwarded to power stage 22.

Upon the completion of the stop sequence duration, power stage 22 then enters a high-impedance state, which is fully muted.

The construction of start and stop sequence generator 26 and the derivation of the duration of the pulses that compensate for clicks and pops in these transitional periods are described in U.S. Pat. No. 6,720,825 B1, incorporated herein by reference. In general, as described in this Patent, the start (and stop) pulse sequences are selected so that the spectrum of the combination of the start sequence with the square wave PWM output has low amplitude in audible frequencies. As mentioned in that Patent, these pulses may be derived analytically or by numerical minimization of the audible energy. It is contemplated that those skilled in the art having reference to this specification, and to the above-incorporated U.S. Pat. No. 6,720,825 B1, will be readily able to construct and implement start and stop sequence generator 26.

Figure 6:
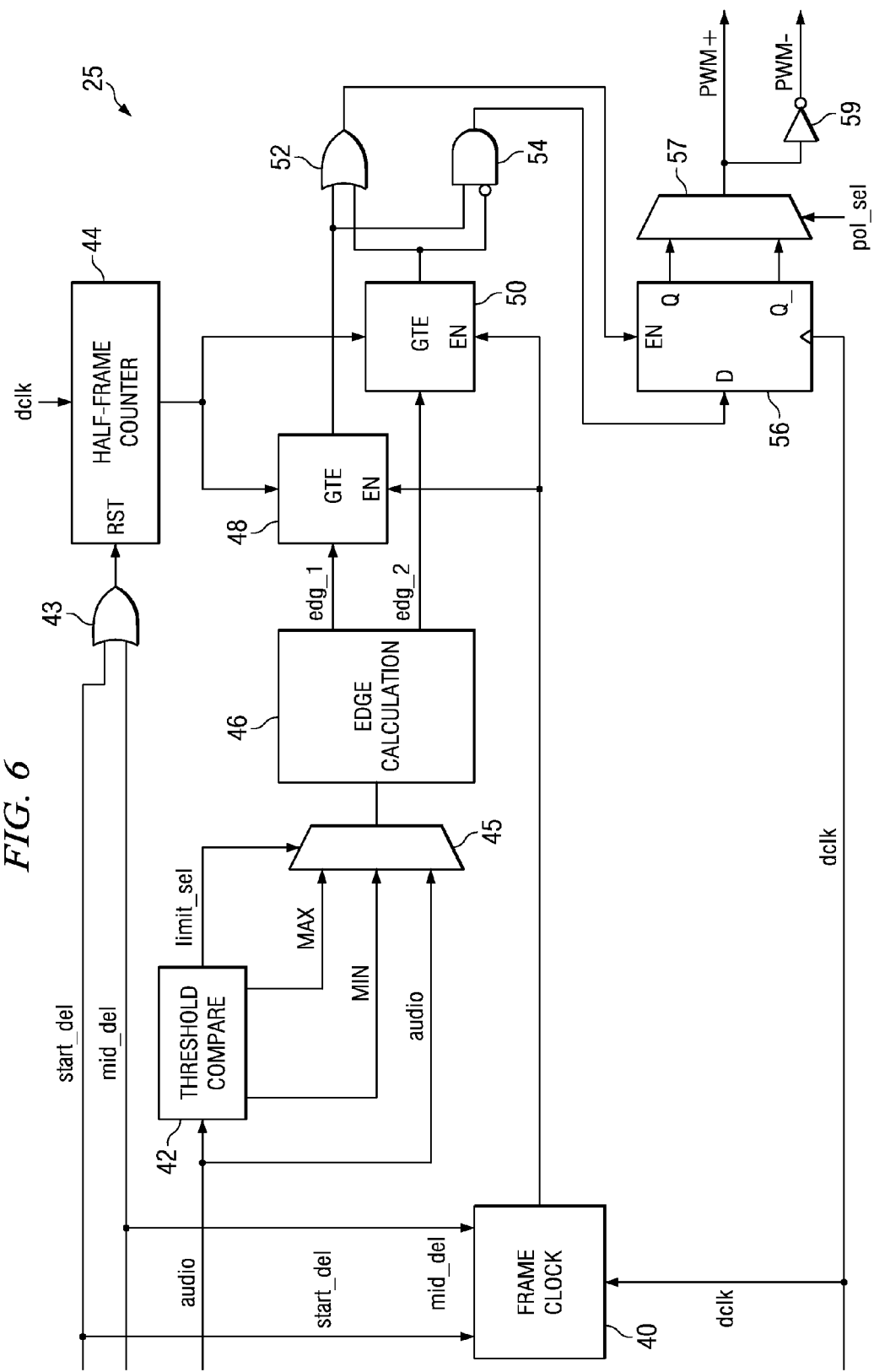
FIG. 6 is an electrical diagram, in block form, of the PCM to PWM conversion function in the audio channel of FIG. 4a according to the preferred embodiment of the invention.

FIG. 6 illustrates the construction of PCM to PWM conversion function 25 according to the preferred embodiment of the invention. As mentioned above, and as evident from FIG. 6, the fully digital nature of audio channel 20, and the reasonably high-speed clock on line dclk in combination with the oversampling and filtering applied by functions 27, 20, enables the digital calculation of the PWM output signals, as opposed to the use of an analog comparator-based implementation of a PWM modulator.

As shown in FIG. 6, PCM to PWM conversion function 25 receives the high-speed clock on line dclk, along with the processed and filtered audio signal from noise shaping and digital non-linear correction function 29 on lines audio, and also the start and mid-frame delimiter signals from interchannel delay function 28 on lines start_del, mid_del, respectively. These signals control the calculation and generation of the PWM output signals on lines PWM+, PWM−, as will become apparent from this description.

The processed input audio signal on lines audio, in PCM form according to this embodiment of the invention, is applied to one input of multiplexer 45, and also to threshold compare circuit 42. Threshold compare circuit 42 compares the current PCM value of the signal on lines audio against minimum and maximum values, which are either pre-stored or programmably written into threshold compare circuit 42. Threshold compare circuit 42 operates to "clip" the audio input signal to these minimum and maximum values, preserving the dynamic range of the input signal from which the PWM signals are to be derived. Accordingly, threshold compare circuit 42 also forwards these maximum and minimum values, on lines MAX and MIN respectively, to corresponding inputs of multiplexer 45. In operation, threshold compare circuit 42 compares the input signal on lines audio to these minimum and maximum values, and issues a control signal on line limit_set to multiplexer 45 according to the result of this comparison. If the input signal on lines audio has a value greater than the maximum, threshold compare circuit 42 causes multiplexer 45 to select lines MAX; conversely, if the input signal on lines audio has a value less than the minimum, threshold compare circuit 42 causes multiplexer 45 to select the lines MIN. If the input signal on lines audio is between the minimum and maximum values, threshold compare circuit 42 causes multiplexer 45 to select lines audio. The signal selected by multiplexer 45, under the control of threshold compare 42, is forwarded as an input to edge calculation circuit 46, which calculates the timing of the edges of the output PWM signals, as will become apparent from the following description.

Edge calculation circuit 46 is digital circuitry for calculating, from the signal received from the output of multiplexer 45, the relative position of the two edges of the output PWM signals within the PWM frame. As mentioned above, the timing of the PWM. output signals is preferably arranged within a frame of cycles of the high-speed clock dclk; in the example of FIG. 4*b*, the zero input signal (50% duty cycle) PWM output positions its edges at 128 and 384 clock cycles within a 512 clock cycle frame. Accordingly, edge calculation circuit 46 is computational circuitry that determines, from the value of the signal received at its input from multiplexer 45, the corresponding duty cycle of the output PWM signal. Edge calculation circuit 46 communicates the results of this calculation as a signal on line edg_1, corresponding to the clock cycle within the frame at which the first (e.g., rising) edge of the PWM output signal is to occur, and as a signal on line edg_2, corresponding to the clock cycle within the frame at which the second (e.g., trailing) edge of the PWM output signal is to occur.

As shown in FIG. 6, lines edg_1 are forwarded to comparator 48 and lines edg_2 are forwarded to comparator 50. Comparator 48 is constructed of logic that issues a signal at its output responsive to the value at an input connected to half-frame counter 44 equaling or exceeding the value currently on lines edg_1, and comparator 50 is constructed of logic that issues a signal at its output responsive to the value at its input connected to half-frame counter 44 equaling or exceeding the then-current value on lines edg_2. Half-frame counter 44 is a counter that advances its count with each cycle of high-speed clock dclk. Half-frame counter 44 has a reset input that is connected to the output of OR gate 43; OR gate 43 receives, at its inputs, the start and mid-frame delimiter signals on lines start_del and mid_del, respectively. Accordingly, within the context of a PWM frame, half-frame counter 44 is reset by an active level on line start_del, at the beginning of a frame (as may be delayed by interchannel delay function 28 for the channel 20), following which half-frame counter 44 advances its contents (and the digital value at its output) with each cycle of high-speed clock dclk, until the mid-frame delimiter signal on line mid_del is driven active at the mid-point of the frame (as may be delayed by interchannel delay function 28), at which point half-frame counter 44 is again reset and begins counting up again with each high-speed clock cycle.

Frame clock circuit 40 is also provided within PCM to PWM conversion function 25, and receives the start and mid-frame delimiter signals on lines start_del and mid_del at inputs, along with the high-speed clock on line dclk. Frame clock circuit 40 issues enable signals to comparators 48, 50 in response to active signals on these clock lines.

Comparators 48 and 50 have outputs coupled to inputs of OR gate 52 and to inputs of AND gate 54. In the case of AND gate 54, the output of comparator 50 is negated at this input, so that AND gate 54 presents a logical "1" at its output in response to the output of comparator 48 being active (high logic level) and the output of comparator 50 being inactive (low logic level). The output of OR gate 52 is connected to the enable input of D-type flip-flop 56, and the output of AND gate 54 is connected to the D input of flip-flop 56. Flip-flop 56 is clocked by high-speed clock dclk. The true (Q) and complement (Q_) outputs of flip-flop 56 are connected to inputs of multiplexer 57, which receives a polarity control signal on line pol_sel, for example from controller 12. The output of multiplexer 57 drives output line PWM+, and via inverter 59 drives output line PWM−.

In operation, therefore, beginning with the beginning of a PWM frame, OR gate 43 receives an active level on line start_del, corresponding to the start delimiter signal as delayed by interchannel delay function 28. Half-frame counter 44 then begins counting up with each cycle of high-speed clock dclk. Assuming comparators 48 and 50 to be enabled by frame clock circuit 40, comparator 48 then issues an active signal at its output, to OR gate 52 once the contents of half-frame counter 44 equals and exceeds the value on lines edg_1. This high level causes OR gate 52 to issue a high logic level at its output, enabling flip-flop 56 to respond to the logic level at its input from AND gate 54. But because the output of comparator 48 is high and the output of comparator 50 is low at this stage, the output of AND gate 54 will be high (the output of comparator 50 being inverted at the input to AND gate 54). Upon the next cycle of high-speed clock dclk, this high level will be latched into flip-flop 56, and presented at the Q output of flip-flop 56 to multiplexer 57. For a positive polarity output, multiplexer 57 will forward this high-level on line PWM+ to power stage 22; conversely, for a negative polarity output, multiplexer 57 will forward the complementary output Q_ from flip-flop 56 to line PWM+. Output line PWM– will, of course, be the logical complement of the level on line PWM+.

Upon the mid-frame delimiter signal on line mid_del occurring, half-frame counter 44 is again reset, and will begin advancing its contents with each cycle of high-speed clock dclk. The outputs of each of comparators 48 and 50 both return to an inactive level at this point, and flip-flop 56 will maintain its current contents, so that the output signals on lines PWM+, PWM_ are maintained. Upon the count from half frame counter 44 equaling or exceeding the value on lines edg_2, comparator 50 issues a high logic level at its output, enabling flip-flop 56 via OR gate 52. However, because it is now the output of comparator 50 that is at a high logic level (the complement of which is applied to the input of AND gate 54), the output of AND gate 54 is at a low level. This low level is latched into flip-flop 56 on the next cycle of high-speed clock dclk, appears at the selected output of flip-flop 56, and causes a transition of the output PWM signals on lines PWM+, PWM–.

As evident from this description, the timing of the transitions of the PWM output signals from PCM to PWM conversion function 25 depend upon the timing of the start and mid-frame delimiters on lines start_del and mid_del respectively. Accordingly, the addition of a delay on these signals by interchannel delay function 28 will correspondingly delay both edges of the PWM output signal, as described above relative to FIG. 4b. This interchannel delay is applied, of course, in the steady-state, during such times as channel 20 is driving load SPKR according to the audio signal. However, according to the preferred embodiment of the invention, the interchannel delay is automatically adjusted in the transition periods following the reduced click and pop start sequence, and immediately preceding the reduced click and pop stop sequence. This automatic adjustment is applied by delay adjust function 32, shown in FIG. 4a, and which will be described in further detail below, with reference to FIG. 7, and in combination with interchannel delay function 28.

Figure 1:
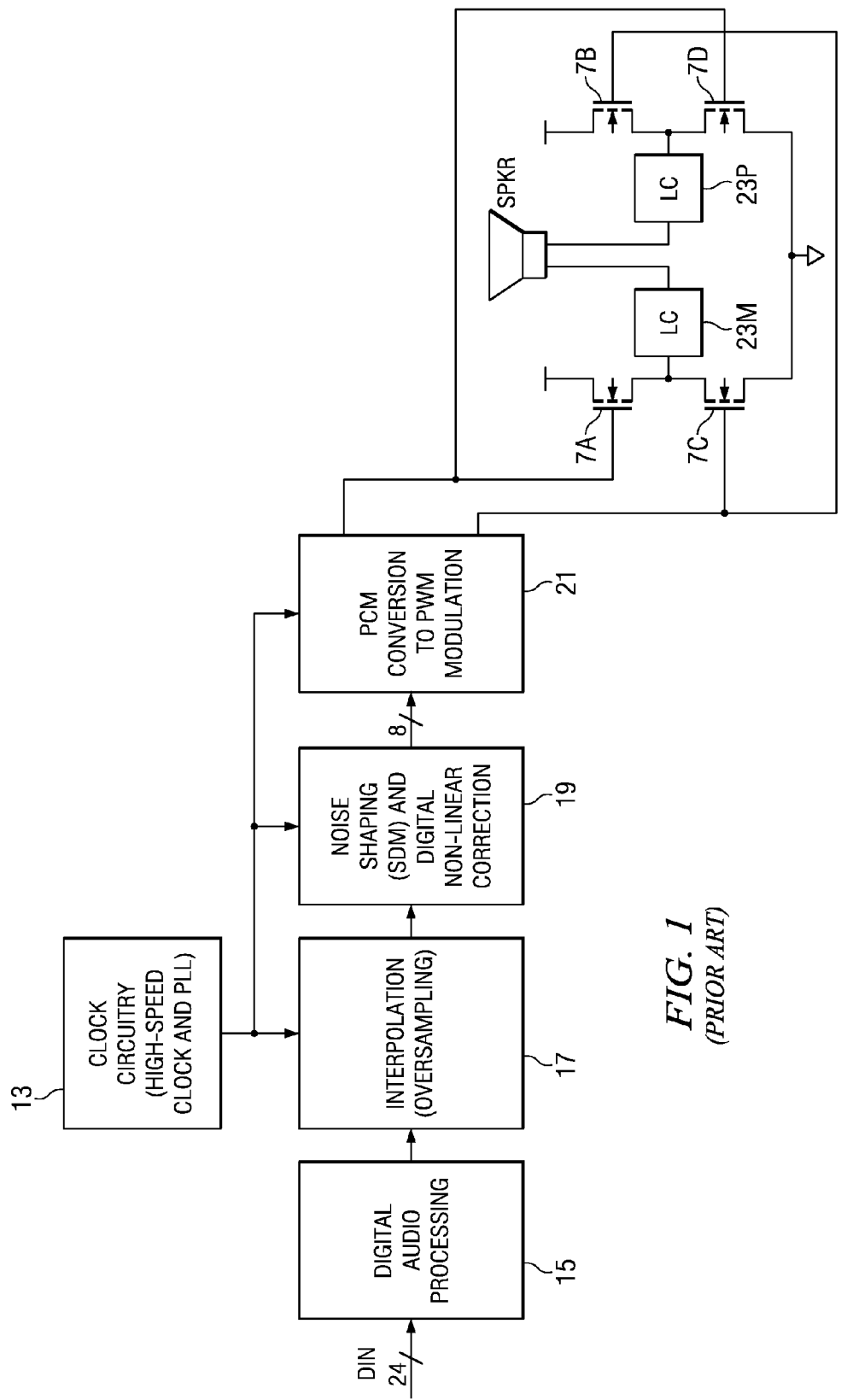
FIG. 1 is an electrical diagram, in block form, of a conventional class AD digital audio amplifier channel.
Figure 2A:
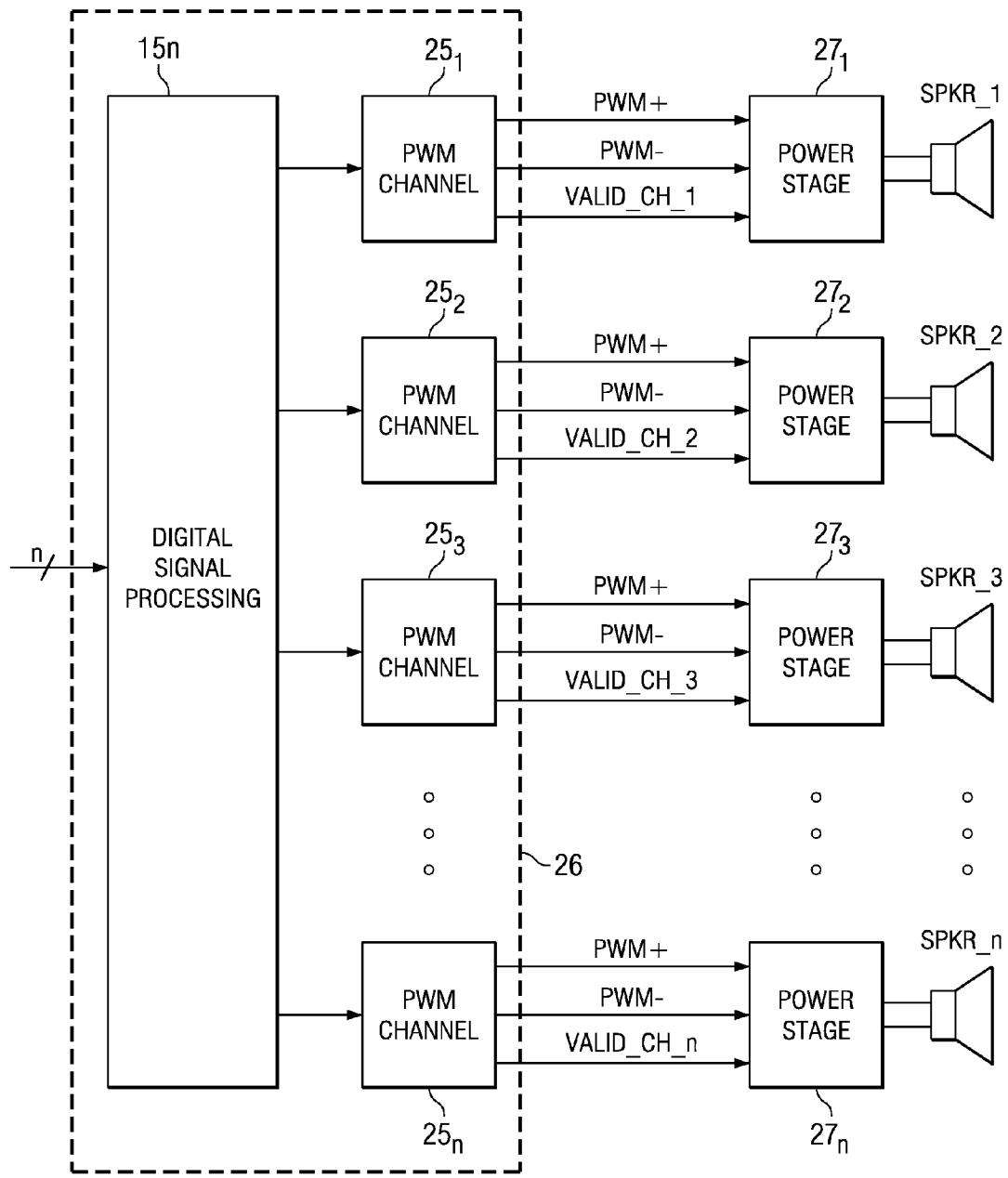
FIG. 2a is an electrical diagram, in block form, of a conventional multiple-channel digital audio amplifier system.

As mentioned above relative to of FIG. 2b, the conventional approach applies the interchannel delay to both channel-specific valid signals (VALID_CH_1, VALID_CH_2) and to the PWM output signals. According to the preferred embodiment of the invention, however, and as shown on FIG. 3, a single VALID signal is applied to power stages 22 for all of channels 20, and interchannel delay among the channels 20 is gradually applied to each channel. This gradual approach permits the simultaneous initiation of the start and stop sequences, while still ensuring that audible clicks and pops are suppressed.

Theory of Operation

Before describing the construction and operation of delay adjust function 32 in combination with interchannel delay function 28, as it gradually applies and removes the interchannel delay for channel 20 on startup and shutdown, respectively, it will be useful to describe how the invention effects the resulting noise reduction. Further, while the specific number and sizes of steps in this gradual increase and decrease of the interchannel delay may be, to some extent, dependent on the particular constraints on the circuit design, it will be instructive to the skilled artisan having reference to this specification to understand that, and how, the noise reduction can be optimized by the selection of these step attributes. Accordingly, the theory of operation of this invention will now be described, because it is contemplated that those skilled in this art and having reference to this specification, including the following description, will then be able to readily adapt this invention within the particular design constraints and performance requirements of each system implementation.

Figure 10:
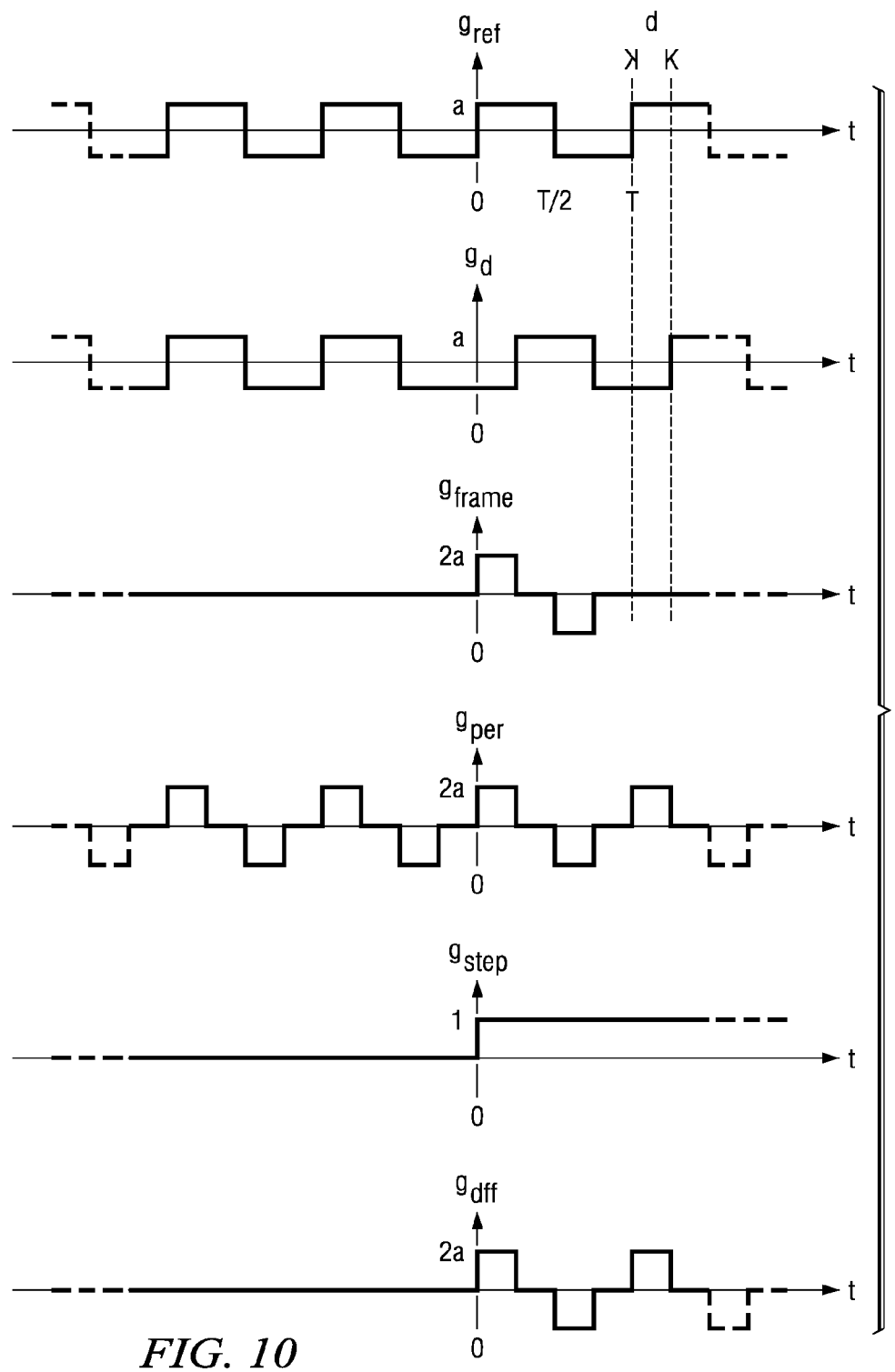
FIG. 10 is a timing diagram illustrating the theory of operation of the preferred embodiments of the invention.

With reference to FIG. 10, signal $g_{ref}(t)$ is a 50% duty cycle PWM signal with infinite duration from time minus infinity to plus infinity. Consequently, this reference signal only contains frequency components at the fundamental frequency 1/T and its harmonics and will not contain any audio-band frequency components, i.e., no click and pop noise will be produced. The signal $g_d(t)$ is equal to $g_{ref}(t)$ for negative t, but at t=0 a delay of d is applied to the waveform. The difference signal $g_{diff}(t)=g_{ref}(t)-g_d(t)$ represents the error signal introduced by the sudden application of delay d and its spectrum will in general contain audio-band components that will be perceived as a click and pop. The first step of the analysis is to calculate the spectrum of $g_{diff}(t)$. This can be done by realizing that the signal $g_{diff}(t)$ can be constructed as the signal $g_{frame}(t)$ repeated periodically with period T (giving signal $g_{per}(t)$) and then multiplied by the step function $g_{step}(t)$.

The spectrum $G_{frame}(f)$ of the signal $g_{frame}(t)$ in FIG. 10, is found by Fourier transformation:

$$G_{frame}(f) = 2ad\frac{\sin(\pi fd)}{\pi fd}(e^{i\pi fd} - e^{-i\pi f(d+T)}), \; 0 \le d \le \frac{T}{2} \quad (1)$$

The signal $g_{per}(t)$ of FIG. 10 is formed by a repetition of $g_{frame}(t)$ with the period T, i.e. $g_{per}(t)$ can be expressed as $$g_{per}(t) = g_{frame}(t) * \sum_{q=-\infty}^{\infty} \delta(t-qT) \quad (2)$$

where * denotes a convolution and $\delta(t)$ is the unit-impulse function. The Fourier series $G_{per}(m)$ of the periodical signal $g_{per}(t)$ becomes:

$$G_{per}(m) = \frac{1}{T} G_{frame}\left(\frac{m}{T}\right) \tag{3a}$$

$$= \frac{1}{T} 2ad \frac{\sin\left(\frac{\pi md}{T}\right)}{\frac{\pi md}{T}} \left(e^{-i\frac{\pi md}{T}} - e^{-i\pi m\frac{(d+T)}{T}}\right)$$

$$= 2ad \frac{\sin\left(\frac{\pi md}{T}\right)}{\pi md} e^{-i\frac{\pi md}{T}} (1 - e^{-i\pi m}) \tag{3b}$$

$$= \frac{2a}{\pi m} \sin\left(\frac{\pi md}{T}\right) e^{-i\frac{\pi md}{T}} (1 - e^{-i\pi m}) \tag{3c}$$

$$= \frac{ia}{\pi m} \left(e^{-2i\frac{\pi md}{T}} - 1\right)(1 - e^{-i\pi m}) \tag{3d}$$

which yields:

$$G_{per}(m) = \begin{cases} \frac{i2a}{\pi m}\left(e^{-2i\frac{\pi md}{T}} - 1\right), & m \text{ odd} \\ 0, & m \text{ even} \end{cases} \tag{3e}$$

The spectrum $G_{step}(f)$ of the step signal $g_{step}(t)$ is found by Laplace transform. This gives the well-known result:

$$G_{step}(f) = \frac{1}{i2\pi f} \tag{4}$$

The signal $g_{diff}(t)$ can be synthesized by the periodical signal $g_{per}(t)$ multiplied by the step signal $g_{step}(t)$. Hence, the spectrum $G_{diff}(f)$ of the signal $g_{diff}(t)$ is calculated as the convolution of the spectra:

$$G_{diff}(f) = G_{per}(m) * G_{step}(f) \tag{5a}$$

which yields:

$$G_{diff}(f) = \sum_{m=-\infty}^{\infty} G_{per}(m) G_{step}\left(f - \frac{m}{T}\right), f \neq \frac{m}{T} \tag{5b}$$

$G_{diff}(f)$ is not defined when f equals the harmonic frequencies, m/T of $g_{per}(t)$, since $G_{step}(f) \to \infty$ for $f \to 0$. The frequency range of interest is however $0 < f < 1/T$, since the inband frequencies are always smaller than the frequency $1/T$—the first harmonic component of $g_{per}(t)$. Only positive frequencies needs to be evaluated, since the amplitude of the spectrum is symmetric in f=0 and the phase is odd symmetrical in f=0. In this frequency range, $G_{diff}(f)$ is defined and can be evaluated, when the well-known limit value of 1 for a sinc function in zero is used.

It can easily be shown that:

$$|G_{per}(m)| \leq \frac{4a}{\pi|m|} \tag{6}$$

hence:

$$|G_{per}(m) G_{step}(f)| \leq \frac{4a}{\pi|m|} \frac{1}{2\pi|f|} \tag{7}$$

For a limited sum in the approximated calculation of $G_{diff}(f)$ the following holds:

$$G_{diff}(f) = \sum_{m=-N}^{N} G_{per}(m) G_{step}\left(f - \frac{m}{T}\right) + G_{err}(f), 0 < f < \frac{1}{T} \tag{8}$$

where:

$$|G_{err}(f)| < \sum_{m=\pm N}^{\pm\infty} \frac{4a}{\pi|m|} \frac{1}{2\pi\left|\frac{m}{T}\right|} = \frac{2aT}{\pi^2} \sum_{m=\pm N}^{\pm\infty} \frac{1}{m^2} \tag{9a}$$

$$= \frac{4aT}{\pi^2} \sum_{m=N}^{\infty} \frac{1}{m^2} <$$

$$\frac{4aT}{\pi^2} \int_{N-1}^{\infty} \frac{1}{m2} dm$$

yielding:

$$|G_{err}(f)| < \frac{4aT}{\pi^2(N-1)} \tag{9b}$$

The error $G_{err}(f)$ by using the finite sum in the calculation of $G_{diff}(f)$ is in other words limited by equation (9b), going to zero as N approaches infinity.

Figure 11:
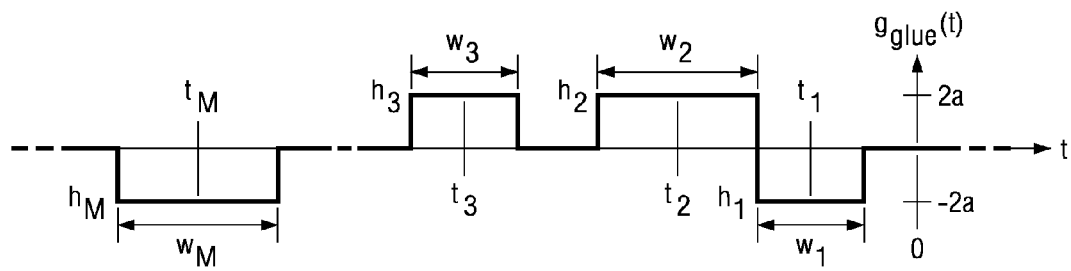
FIG. 11 is another timing diagram illustrating the theory of operation of the preferred embodiments of the invention.

An interesting figure that says something about the disturbance of the start transient is the inband energy, which is a measure of the audible click and pop level. The inband energy $E_{ib}$ of a real signal h(t) is calculated as:

$$E_{ib} = \int_{-f_{ib}}^{f_{ib}} |H(f)|^2 df = 2 \int_0^{f_{ib}} |H(f)|^2 df \tag{10}$$

where H(f) is the Fourier transform of h(t) and $f_{ib}$ is the maximum inband frequency. The next step in the analysis is minimize the inband energy of the error signal $g_{diff}(t)$, i.e., minimize the click and pop level. This can be achieved by adding a certain leading pulse sequence to $g_{diff}(t)$. This leading pulse sequence can be added to shape the spectrum of the resulting signal so that the resulting transient has minimum inband energy. A sequence can be a sum of square pulses with amplitudes $h_k$, positions of the pulse-centers $t_k$, and pulse-widths $w_k$. The start sequence is constrained to be valid with respect to the way the difference signal is generated; e.g., the pulse amplitude must be $\pm 2\alpha$ or zero. A general sequence is shown in FIG. 11, in which the spectrum $G_{glue}(f)$ of the sequence $g_{glue}(t)$ is:

$$G_{glue}(f) = \sum_{k=1}^{M} h_k w_k \frac{\sin(\pi f w_k)}{\pi f w_k} e^{-i2\pi f t_k} \tag{11}$$

When the start signal $g_{glue}(t)$ is added to $g_{diff}(t)$, the resulting spectrum $G_{res}(f)$ becomes:

$$G_{res}(f) = G_{glue}(f) + G_{diff}(f) \tag{12}$$

It is desired to reduce the disturbance of the resulting signal, e.g. by reducing the inband energy. This can be done either analytical or by numerical minimization of the energy, by means of equation (10). According to this invention, this minimization is applied in the introducing (or removing) of the interchannel delay.

Figure 12:
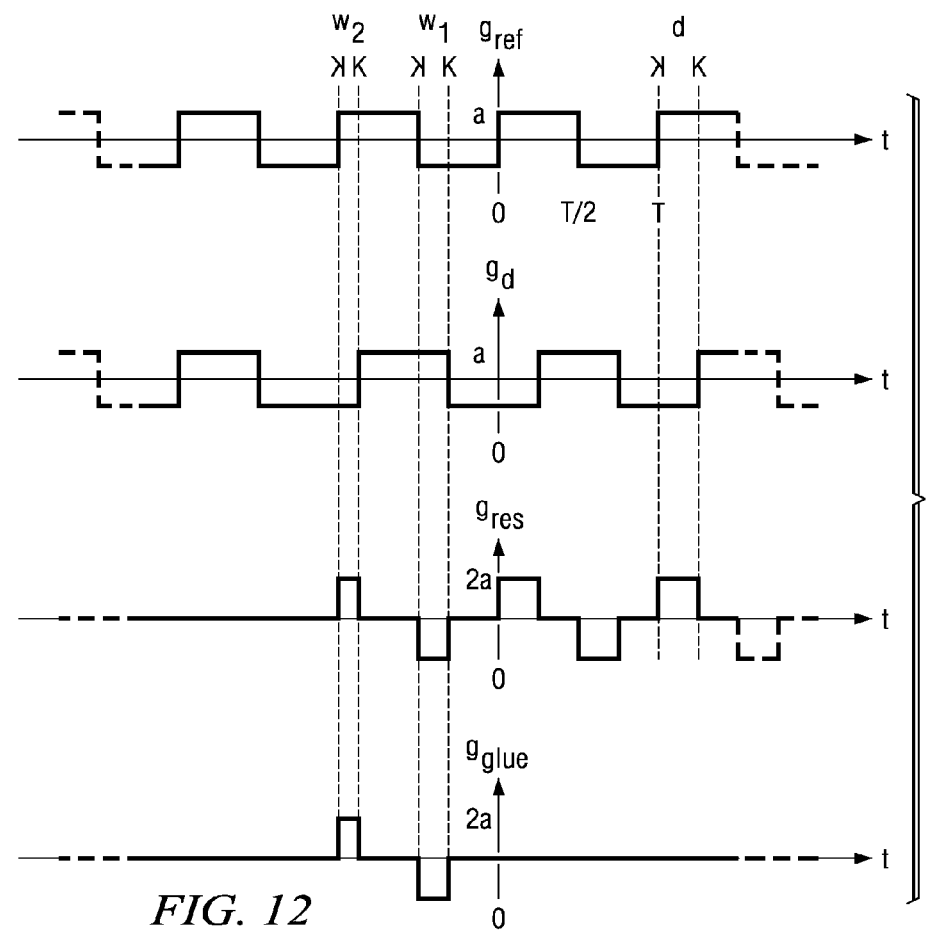
FIG. 12 is another timing diagram illustrating the theory of operation of the preferred embodiments of the invention.

To minimize the inband transient energy when introducing a delay, a glue sequence $g_{glue}(t)$ as shown in FIG. 12 is introduced. The spectrum of this glue sequence becomes:

$$G_{glue}(f) = \qquad (13)$$
$$-2aw_1 \frac{\sin(\pi f w_1)}{\pi f w_1} e^{-i\pi f (w_1-T)} + 2aw_2 \frac{\sin(\pi f w_2)}{\pi f w_2} e^{-i\pi f (w_2-2T)}$$

The resulting signal $g_{res}(t)$ is formed by:

$$g_{res}(t) = g_{glue}(t) + g_{diff}(t) \qquad (14)$$

The spectrum $G_{res}(f)$ of $g_{res}(t)$ is $$G_{res}(f) = G_{glue}(f) + G_{diff}(f) \qquad (15)$$

Figure 13:
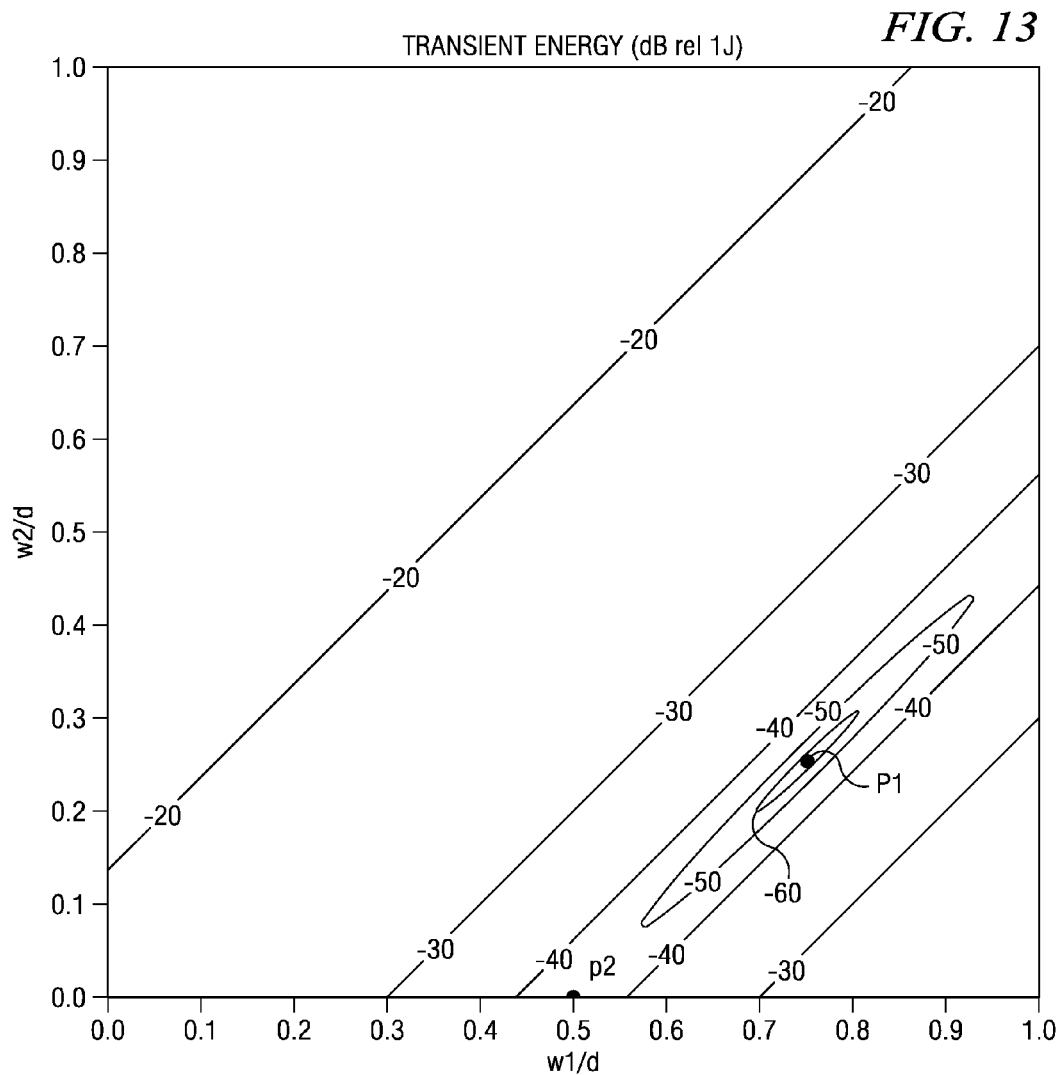
FIG. 13 is a plot of transient inband energy versus pulse widths of start sequence pulses, for an exemplary implementation of the invention.

The inband energy of $G_{res}(f)$ is calculated by equation (10) and minimized with respect to $w_1$ and $w_2$. The inband energy as a function of $w_1$ and $w_2$ is shown in FIG. 13, for the parameters of a=1 volt, T=1 second, $$d = \frac{T}{4}, \text{ and } f_{ib} = \frac{1}{20T}.$$

In general, it has been observed that the inband energy for fixed $w_1$ and $w_2$ grows with increasing absolute value of the delay d. Since it is only necessary to cover a range of T/2 for the delay d, then d=±T/4 represents the worst case click and pop.

In this example, the minimum inband transient energy is found for the parameters:

$$w_1 = 0.7493 \; w_2 = 0.2507 \qquad (19)$$

which is marked with the dot p1 in FIG. 13. The inband transient energy $E_{ib}$ in p1 is $$E_{ib} = -73.7 \text{ dB rel. 1J} \qquad (20)$$

Figure 14:
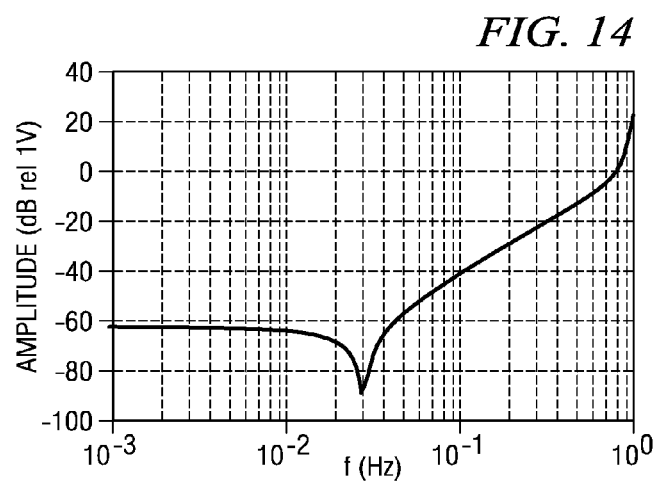
FIG. 14 is a plot of an amplitude spectrum for an example of an optimal start sequence according to the invention.
Figure 15:
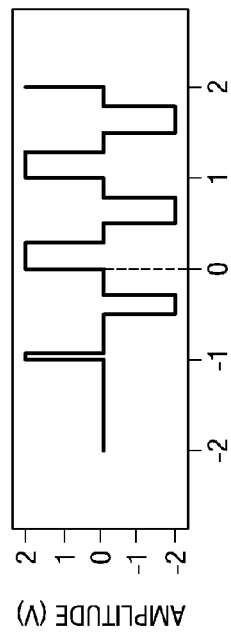
FIG. 15 is a timing diagram illustrating the example of the optimal start sequence according to the invention, resulting in the spectrum of FIG. 14.

The amplitude of the frequency spectrum $G_{res}(f)$ for the optimal parameter set is showed in FIG. 14 and the corresponding delayed PWM signal $g_d(t) = g_{ref}(t) - g_{res}(t)$ is shown in FIG. 15. To simplify the implementation so that all delays are exact multiples of the DCLK period, the optimum of equation (19) can be rounded to the values $w_1 = \frac{3}{4}$ and $w_2 = \frac{1}{4}$ with only a minor increase of approx. 3.5 dB in the in-band energy. If the final delay d is multiples of 4 DCLK cycles, then all delays introduced (i.e., the sequence . . . 0,0, d/4, 3d/4, d, d, . . . ) are multiples of one DCLK period and the implementation can be done as a digital sequential network clocked by DCLK. When $w_2 = 0$, the glue sequence only consists of a single pulse of width $w_1$. The optimal start sequence, using a single pulse is marked p2 in FIG. 13. The parameters for the optimal single pulse start sequence are:

$$w_1 = 0.5000 \cdot d \; w_2 = 0 \qquad (21)$$

The corresponding inband transient energy in p2 is $$E_{ib} = -46.9 \text{ dB rel. 1J} \qquad (22)$$

The trivial delay introduction corresponds to the origin in the contour plot, where the parameters are $$w_1 = 0 \; w_2 = 0 \qquad (23)$$

and the inband transient energy $E_{ib}$ is $$E_{ib} = -22.0 \text{ dB rel. 1J} \qquad (24)$$

The insertion of the optimal two-pulse glue sequence when introducing the inter channel delay gives an improvement on 51.7 dB in the inband transient energy compared to a trivial delay introduction. If a lower transient energy is desired, a glue sequence of more than two pulses can be applied. Further in the alternative, a single pulse glue sequence may be applied, at a cost of increased transient energy relative to the optimal two-pulse sequence.

Construction and Operation

Figure 7:
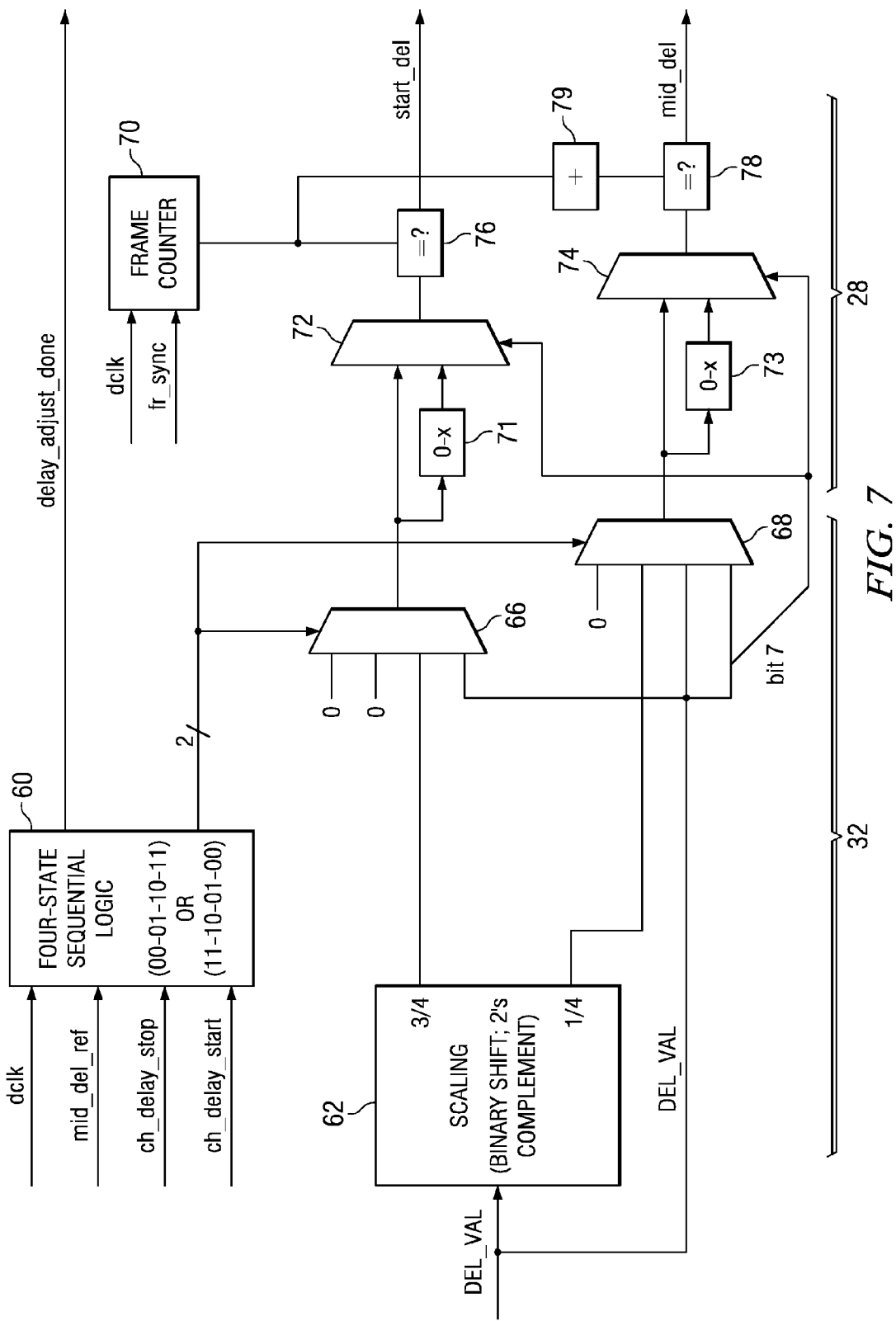
FIG. 7 is an electrical diagram, in schematic form, of interchannel delay functional circuitry in the PCM to PWM conversion function of FIG. 6, constructed according to the preferred embodiment of the invention.

Referring now to FIG. 7, the construction and operation of the combination of delay adjust function 32 and interchannel delay function 28 according to this preferred embodiment of the invention, which provides a gradually increasing (on startup) and decreasing (on shutdown) interchannel delay for its associated channel 20, will now be described in detail. In this exemplary implementation, the interchannel delay is increased, on startup, from a zero delay state for a first PWM edge, to one-fourth of the full interchannel delay on the second PWM edge, to three-fourths of the full interchannel delay on the third PWM edge, and to the full interchannel delay for all PWM edges after that; the sequence is reversed (full, to three-fourths, to one-fourth, to zero delay), for transitions from audio output to a muting condition. It has been observed, in connection with this invention, that this gradual increasing and decreasing of interchannel delay reduces energy in the audible band that would otherwise be present with no such interchannel delay. It is also contemplated that other schemes for increasing and decreasing the interchannel delay may alternatively be applied. For example, a simpler approach would simply be a two-step increase, from zero to 50% delay to full delay over three PWM edges, and that such an approach would provide some relief from audible noise. Further in the alternative, more steps in the increase and decrease of the interchannel delay may alternatively be used, to provide further noise suppression. The particular example of FIG. 7 is believed, however, to provide a good tradeoff between circuit complexity and noise suppression, for most modern digital audio applications.

As shown in FIG. 7, the digital value of the desired full interchannel delay for channel 20 is presented on lines DEL_VAL to scaling circuit 62, and to inputs of multiplexers 66, 68. Scaling circuit 62 may be constructed from conventional logic to effect binary shifts, and to generate arithmetically inverse (i.e., two's complement) values of the value on lines DEL_VAL either as received or as shifted. In its operation, scaling circuit 62 receives the full interchannel delay on lines DEL_VAL, and presents a digital value of one-fourth of this full delay (right shifted by two bits) to an input of multiplexer 68, and also presents a digital value of three-fourths of this full delay (e.g., the full delay added to the two's complement of the one-fourth delay value) to an input of multiplexer 66.

Multiplexer 66 also receives two zero-valued inputs, along with the one-fourth delay value from scaling circuit 62 and the full delay value on lines DEL_VAL. Multiplexer 66 also receives a two-bit select signal, which indicates which of its four inputs are to be forwarded to its output. In this example, the two-bit select signal is associated with the inputs in a sequence so that select signal values 00 and 01 select corresponding ones of the two zero-valued inputs, respectively, select signal value 10 selects the one-fourth delay value from scaling circuit 62, and select signal value 11 selects the full delay value on lines DEL_VAL. The two-bit select signal is generated by sequential logic 60, as will be described in further detail below.

Multiplexer 68 also receives the same two-bit select signal from sequential logic 60, at its control inputs. Multiplexer 68 has a zero-valued input associated with select signal value 00, and has the three-fourths delay value from scaling circuit 62 at its input associated with select signal value 01. The full delay value on lines DEL_VAL are applied to the two inputs of multiplexer 68 that are associated with select signal values 10 and 11.

The output of multiplexer 66 is applied to an input of multiplexer 72, and to an input of arithmetic inverse circuit 71, which effectively subtracts the value at the output of multiplexer 72 from zero, and applies the difference to a second input of multiplexer 72. Similarly, the output of multiplexer 68 is applied to an input of multiplexer 74, and to an input of arithmetic inverse circuit 73 for subtraction from zero and application to a second input of multiplexer 74. The control inputs of multiplexers 72, 74 are controlled by the most significant bit (e.g., bit 7 of an eight-bit value) of the fully delay value on lines DEL_VAL. This most significant bit is a sign bit, and as such controls multiplexers 72, 74 according to whether the full interchannel delay is of positive (retarding) polarity or negative (advancing) polarity.

The output of multiplexer 72 is applied to an input of equal comparator 76, and the output of multiplexer 74 is applied to an input of equal comparator 78. Comparator 76 also receives the output of frame counter 70, which is a conventional digital counter clocked by high-speed clock dclk, and which maintains a count of the cycles within a PWM frame; frame counter 70 is reset at the beginning of each frame by the frame synchronization clock on line fr_sync. The output of frame counter 70 is also coupled to a second input of comparator 78, but after the subtraction of a fixed offset (e.g., a value one-half the number of dclk cycles in a PWM frame) by adder 79. The output of comparator 76 is the start delimiter signal on line start_del, while the output of comparator 78 is the mid-frame delimiter signal on line mid_del.

In effect, according to this construction, multiplexers 72, 74, along with arithmetic inverse circuits 71, 73, comparators 76, 78, and frame counter 70, constitute interchannel delay function 28 in the architecture of FIG. 3. Scaling circuit 62 and sequential logic 60, along with multiplexers 66, 68 constitute delay adjust function 32, as this combination of circuitry adjusts the interchannel delay applied to multiplexers 72, 74 for the first few PWM cycles, as will become apparent below.

Sequential logic 60 receives clock, control, and frame reference signals, including high-speed clock dclk, a reference signal indicating the un-delayed mid-frame delimiter on line mid_del_ref, and control signals indicating the beginning and duration of a startup sequence (on line ch_delay_start) and shut down (on line ch_delay_stop). According to this preferred embodiment of the invention, sequential logic 60 cycles through the four output states applied to multiplexers 66, 68 with each PWM output edge. In this example, in the startup situation in which channel 20 is making the transition from a muted state to full audio (FIG. 5a), the sequence of two-bit output states from sequential logic 60 will be 00→01→10→11; conversely, the two-bit output sequence in the shutdown, or muting, situation in which channel 20 is making the transition from full audio to muted, the output sequence will be 11→10→01→00. Sequential logic 60 also issues a signal on line delay_adjust_done to indicate when delay adjust function 28 has completed its transition operation, such that either the full (on startup) or zero (on shutdown) interchannel delay is in place.

The operation of delay adjust function 32 in combination with interchannel delay function 28, for a given channel 20, will now be described relative to FIG. 8a. In this example, a startup operation will be described, corresponding to the sequence of FIG. 5a in which channel 20 proceeds from a muted condition to full audio. More specifically, the operation illustrated in FIG. 8a corresponds to the PWM cycles following the reduced click and pop start sequence (i.e., following the "PWM START SEQUENCE" of FIG. 5a), and as such corresponds to the "zero PWM" cycles, which in this class AD example, are issued as 50% duty cycle PWM signals. In this example, signal ch_delay_start is asserted to sequential logic 60, and signal ch_delay_stop is deasserted, indicating a startup sequence. Also in this example, a positive polarity interchannel delay will be applied to channel 20, to delay the delimiter signals start_del, mid_del.

Figure 8A:
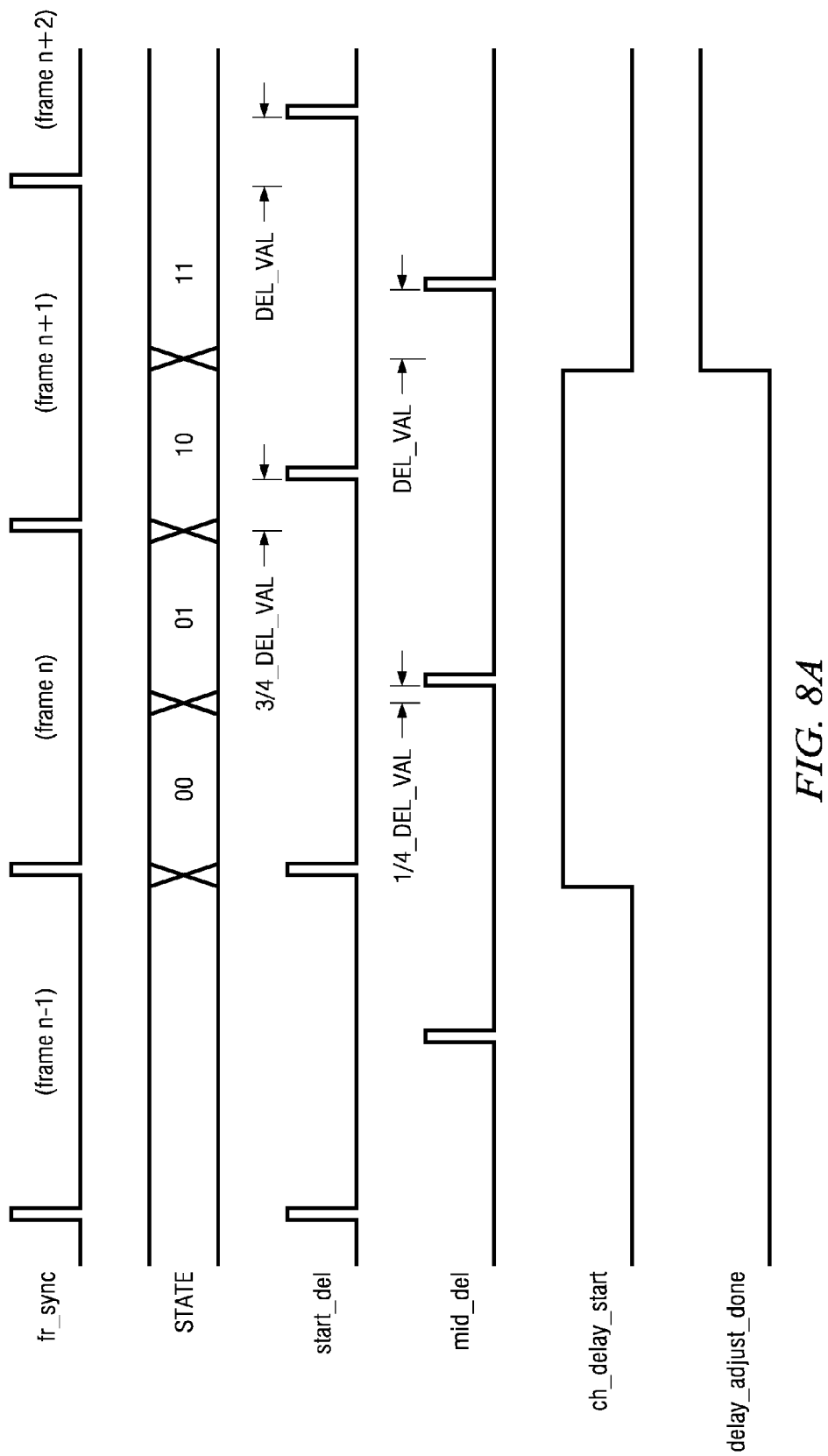
FIGS. 8a through 8c are timing diagrams illustrating the operation of the interchannel delay functional circuitry of FIG. 7, according to the preferred embodiment of the invention

As shown in FIG. 8a, frame synchronization clock fr_sync appears as a pulse (of a duration corresponding to one cycle of high-speed clock dclk) at the beginning of each PWM frame. Also shown in FIG. 8a are the state values of sequential logic 60 (line STATE of FIG. 8a), with numerical values corresponding to the state communicated on the control lines from sequential logic 60 to multiplexers 66, 68. FIG. 8a also illustrates the start and mid-frame delimiter signals start_del and mid_del, respectively.

Prior to the delay adjustment process, in frame n−1 of FIG. 8a, the signal ch_delay_start is inactive. In this state, during which the reduced click and pop start sequence is occurring, no interchannel delay is applied. Referring back to FIG. 4a, this is accomplished by way of start and stop sequence generator 26 controlling multiplexer 30 to select the output of start and stop sequence generator 26 for application to lines PWM+, PWM−. In FIG. 8a, by way of example, the relationship of the start and mid-frame delimiters start_del and mid_del, respectively, to the frame synchronization clock fr_sync, with no interchannel delay, is illustrated.

Upon the completion of frame n−1 and thus the beginning of frame n, the signal on line ch_delay_start is asserted, to begin the process of gradually increasing the interchannel delay according to this embodiment of the invention. At this time (if not before), sequential logic 60 is in state 00. Referring to FIG. 7, this state 00 causes each of multiplexers 66, 68 to select a zero-valued input for application to multiplexers 72, 74; because channel 20, in this example, has a positive interchannel delay, multiplexers 72, 74 will select the output of multiplexers 66, 68 for use in generating the delimiter signals. With a zero value applied to comparator 76, the start delimiter signal start_del is not delayed by interchannel delay function 28, but is issued with frame counter 70 having a zero (newly reset) value. As such, start delimiter signal start_del is issued substantially synchronously with the frame synchronization clock fr_sync.

Prior to or at the mid-point of frame n, for example in response to the mid-frame reference signal mid_del_ref (FIG. 7), sequential logic 60 advances to the next state 01. This advances the selection of multiplexers 66, 68 to select their respective second inputs; at multiplexer 66, the second zero-valued input is selected, and multiplexer 68 selects the one-fourth delay output from scaling circuit 62. Accordingly, this one-fourth delay value is forwarded by multiplexer 68 to multiplexer 74, which in turn (in this positive polarity case, with bit 7 of DEL_VAL being zero) forwards the one-fourth delay value to comparator 78. Upon the value of frame counter 70 less the mid-frame count (adder 79) equaling the one-fourth of the full interchannel delay value on lines DEL_VAL, comparator 78 issues an active pulse for one cycle of high-speed clock dclk on line mid_del, as the mid-frame delimiter. As shown in FIG. 8a, this active pulse on line mid_del is delayed from the true mid-frame point by the interchannel delay ¼_DEL_VAL.

Prior to or at the beginning of the next frame n+2, sequential logic 60 advances its state to the state 10. This state value is applied to multiplexers 66, 68, causing multiplexer 66 to select the three-fourths delay value, which is forwarded through multiplexer 72 to comparator 76. Upon the contents of frame counter 70 then reaching a value corresponding to this three-fourths of the full interchannel delay value on lines DEL_VAL, comparator 76 issues an active level pulse on line start_del, for a duration of one cycle of the high-speed clock dclk. FIG. 8a illustrates the generation of this pulse, at a time delayed from the true mid-frame point by the interchannel delay ¾_DEL_VAL as shown.

Prior to or upon reaching the mid-frame point of this next frame n+2, sequential logic 60 advances to state 11, causing each of multiplexers 66, 68 to select the interchannel delay value on lines DEL_VAL for forwarding to multiplexers 72, 74, respectively, and thus (considering the positive polarity delay), to comparators 76, 78, respectively. Comparator 78, for the mid-frame point of frame n+2 and onward, issues its active pulses upon the contents of frame counter 70, less the mid-frame value applied by adder 79, reaching the value on lines DEL_VAL. In the beginning of the next frame n+3, and after resetting of frame counter 70 by frame synchronization clock fr_sync, comparator 76 issues an active pulse on line start_del when the contents of frame counter 70 reaches the value on lines DEL_VAL. As shown in FIG. 8a, the start and mid-frame delimiter signals on lines start_del and mid_del, respectively, are each delayed by the full interchannel delay on lines DEL_VAL. And upon sequential logic 60 reaching state 11, the active signal on line delay_adjust_done is asserted, as shown in FIG. 8a, indicating that the full interchannel delay is being applied for this channel 20. The progression to full audio output then continues, as shown in FIG. 5a.

Figure 8B:
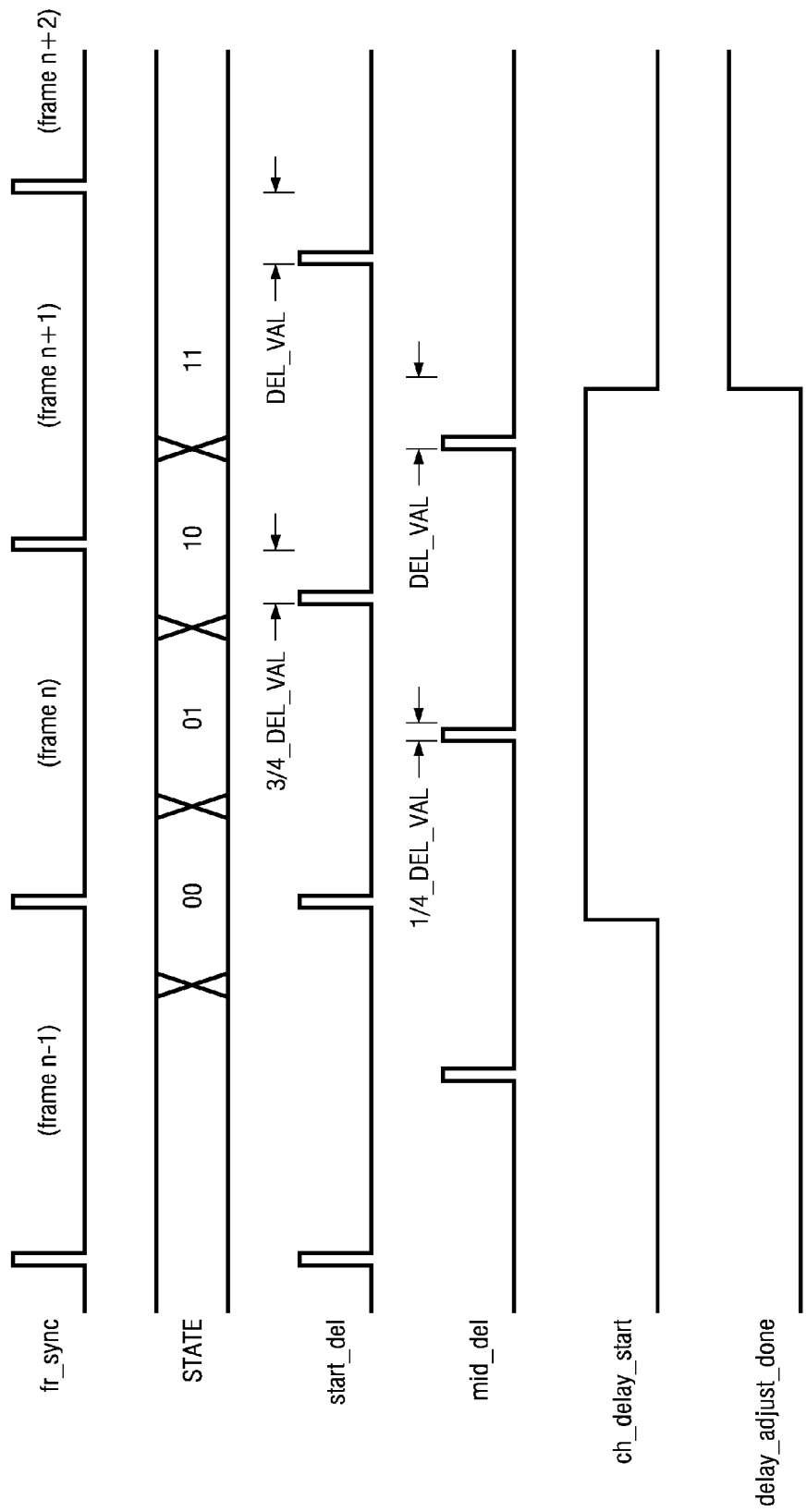

As mentioned above, the full interchannel delay value on lines DEL_VAL can have a negative value, in which case the start and mid-frame delimiters start_del, mid_del are issued in advance of the corresponding points of the PWM frame. But again, according to this embodiment of the invention, this negative interchannel delay is applied in a gradually increasing manner. This increasing of the advancing of the delimiter signals is effected by the full interchannel delay value on lines DEL_VAL having a leading "1" bit, which causes each of multiplexers 72, 74 to select the outputs of arithmetic inverse circuits 71, 73 for forwarding to comparators 76, 78, respectively. With these inverse values, comparators 76, 78 will issue their active pulses in response to the value stored in frame counter 70 equaling a value in the previous frame (for comparator 76) or in advance of the frame mid-point (for comparator 78). The advancing interchannel delay is illustrated in FIG. 8b, by the edge of mid-frame delimiter mid_del in frame n occurring in advance of the true mid-frame point by a time ¼_DEL_VAL, and by the next start delimiter start_del after that occurring in advance of the frame synchronization clock fr_clk by a time ¾_DEL_VAL, as shown. Eventually, both delimiters start_del, mid_del are issued in advance of their zero-delay points by the full interchannel delay value on lines DEL_VAL.

During muting or shutdown of audio channel 20 as shown in FIG. 5b, the sequence of state values of sequential logic 60 are reversed, as mentioned above. In this case, the interchannel delay of delimiter signals start_del, mid_del is gradually reduced, in three steps, from the full interchannel delay on lines DEL_VAL for channel 20 to no interchannel delay, following which the reduced click and pop stop sequence can be applied by start and stop sequence generator 26 of FIG. 3.

Figure 8C:
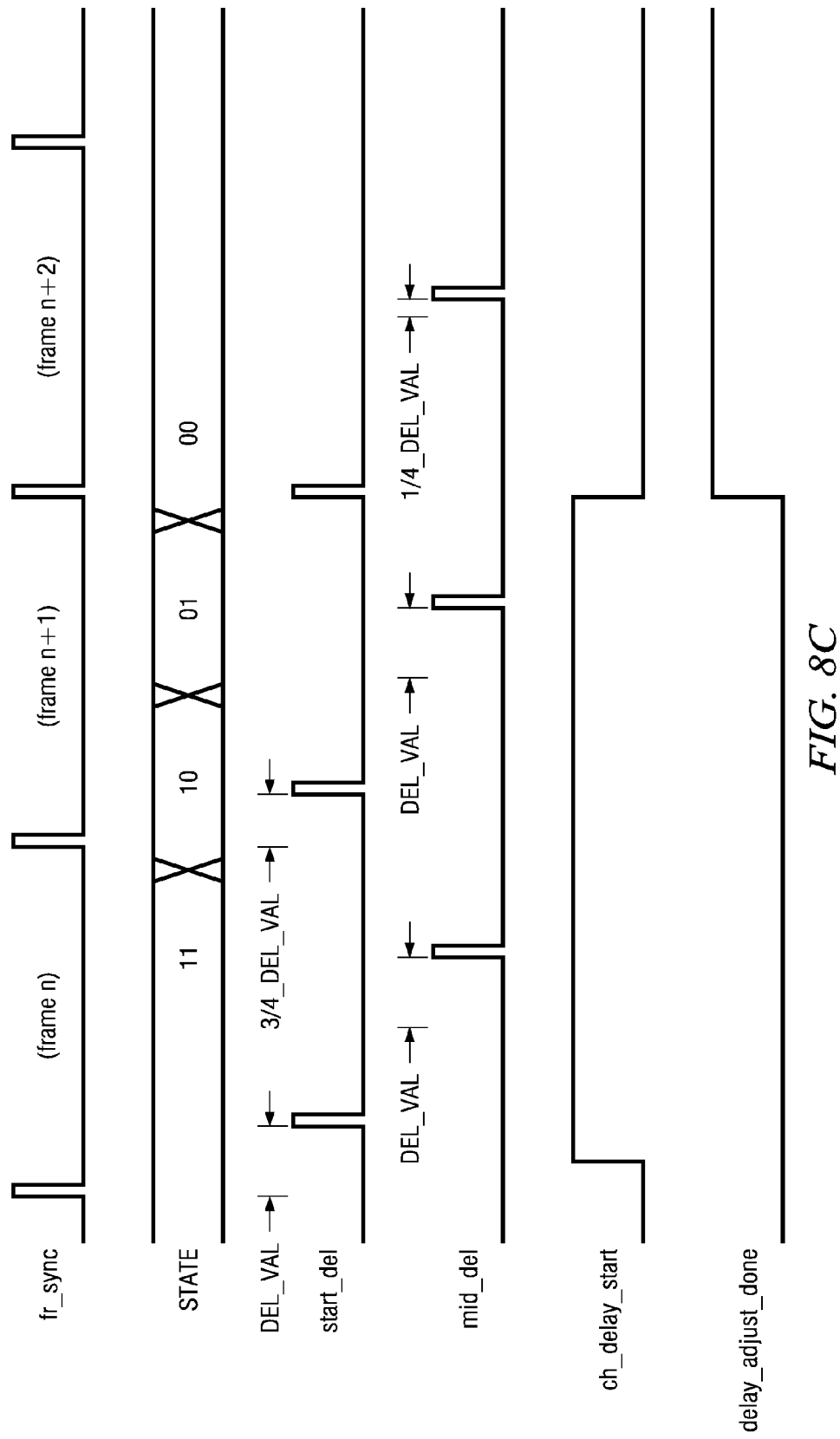

FIG. 8c illustrates the operation of delay adjust function 32 in combination with interchannel delay function 28 of FIG. 7, for a given channel 20, in connection with such a muting or shutdown transition. In this case, prior to the assertion of the signal on line ch_delay_stop, both of start delimiter start_del and mid-frame delimiter mid_del are delayed, from the corresponding points within the frame, by the full interchannel delay value on lines DEL_VAL. Upon assertion of the signal ch_delay_stop at about the beginning of frame n, sequential logic 60 enters its state 11, in which case multiplexers 66, 68 continue to select lines DEL_VAL for forwarding toward comparators 76, 68. Accordingly, start delimiter start_del in frame n continues to issue with its full interchannel delay value DEL_VAL, as does mid-frame delimiter mid_del.

At the beginning of frame n+1, however, sequential logic 60 is in its state 10. Accordingly, multiplexer 66 is controlled to select the output of scaling circuit 62 corresponding to three-fourths of the full interchannel delay on lines DEL_VAL for application to multiplexer 72. Following the operation of multiplexer 72 and comparator 76, as discussed above, start delimiter start_del is then issued by comparator 76, after a delay of three-fourths of the full interchannel delay on lines DEL_VAL from the zero delay point (i.e., the beginning of the frame). Prior to the midpoint of frame n+1, sequential logic 60 is in its state 01, which causes multiplexer 68 to select the output from scaling circuit 62 corresponding to one-fourth of the full interchannel delay on lines DEL_VAL, which is applied to multiplexer 74 so that mid-frame delimiter mid_del is issued in this frame after a delay of one-fourth of the full interchannel delay on lines DEL_VAL, as shown in FIG. 8c. Finally, beginning with frame n+2, sequential logic 60 is in its 00 state, so that multiplexers 66, 68 are each selecting zero-valued inputs for forwarding to multiplexers 72, 74 and comparators 76, 78. For all subsequent PWM frames, up to the point at which, or including, the reduced click and pop stop sequence, no interchannel delay is applied by interchannel delay function 28 in this channel 20.

And conversely, if the interchannel delay is a negative delay (i.e., advancing the delimiters as in FIG. 8b), the stop sequence will operate in a corresponding manner to gradually remove the extent to which the delimiter signals are advanced ahead of the start and mid-frame points.

In this way, as described herein, the interchannel delay applied to the start and mid-frame delimiters start_del, mid_del, respectively, is automatically increased or decreased during transitions into and out of muting. This gradual increase, which may be in any number of transitional steps from one to several, has been observed to greatly reduce the audible noise energy that would otherwise be present if the interchannel delay among the various channels 20 in the system would be abruptly applied or removed.

As shown in FIG. 3, considering that multiple channels 20 are provided within processor 10 and that channels 20 will have differing interchannel delay values, relative to one another, those skilled in the art having reference to this specification will recognize that the fractional incrementing and decrementing of this interchannel delay will effect excellent spread among the various channels 20 upon muting and unmuting. It is of course contemplated that the particular interchannel delay values for each of these channels may be selected according to the desired system performance, as known in the art. Regardless of the specific values, the fractional incrementing and decrementing of the delays according to this invention will provide reduced audible noise and excellent performance.

Figure 9:
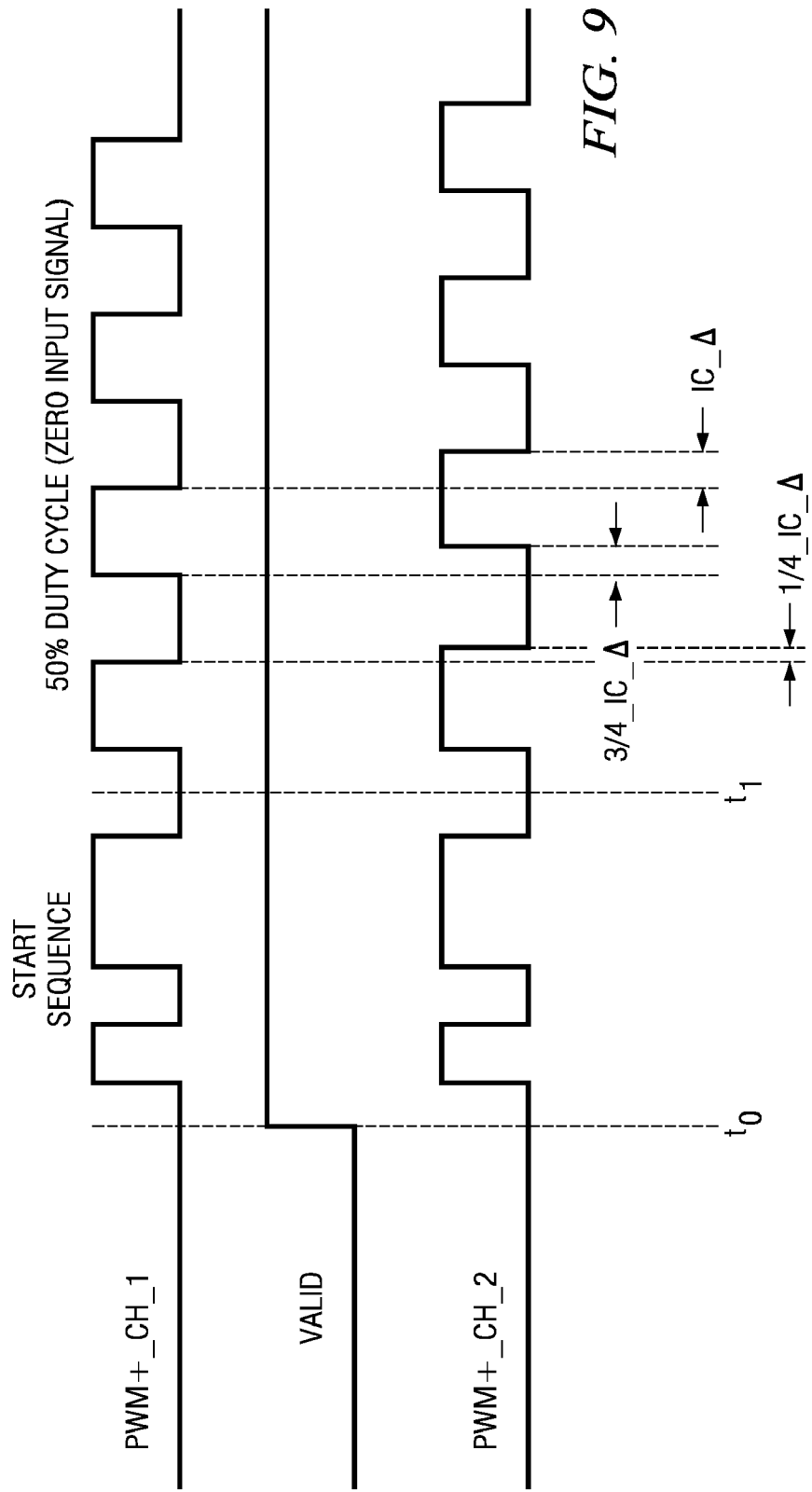
FIG. 9 is a timing diagram illustrating the operation of the processor of FIG. 3 in a startup, or unmuting, sequence according to the preferred embodiment of the invention.

Referring now to FIG. 9, the relationship between two such channels 20, one being a reference channel and the other having an interchannel delay value, and the application of the incrementally increasing interchannel delay after a reduced click and pop start sequence, will now be described, according t6 the preferred embodiment of the invention. As shown in FIG. 3, a single signal line VALID is issued by processor 10 to all of the power stages 22 in common, upon the startup or unmuting of channels 20 from a high-impedance muted state. In the example of FIG. 9, the reduced click and pop start sequence is applied to the PWM outputs of both channel simultaneously, following the assertion of the signal VALID to power stages 22 at time $t_0$. A sequence of PWM pulses are generated by each of channels 20, and are simultaneously applied to power stages 22 by all channels 20, as shown in FIG. 9.

At time $t_1$, the start sequence ends, and the gradual application of interchannel delay according to the preferred embodiment of the invention is then effected. The first PWM rising edges at channels CH_1 and CH_2 following time $t_1$ are coincident, as shown in FIG. 9. But in response to this rising edge, in this example, the first delay adjustment is implemented. Accordingly, prior to the next falling edge of the PWM signal, the PWM signal on channel CH_2 receives an interchannel delay, relative to channel CH_1, of one-fourth of its full interchannel delay value, as shown in FIG. 9 by the measurement /1;4_ICΔ. The next PWM edge at channel CH_2, which is a rising edge in this example, is delayed by three-fourths of the full interchannel delay, as shown in FIG. 9 by the measurement ¾_ICΔ. And beginning with the next PWM edge after *that*, and for all subsequent *edges*, the PWM edges on channel CH_2 are *delayed*, relative to channel CH_1, by the full interchannel delay ICΔ. T*his* continues through the zero input signal phase of the startup *sequence*, and remains during audio output from processor 10.

Conversely, upon the shutdown or muting of processor 10, the interchannel delay is gradually removed prior to effecting the reduced click and pop stop sequence, as described above relative to FIG. 8c.

According to this embodiment of the invention, therefore, it is contemplated that reduced audible noise in the transitions into and out of muting of the audio system are greatly reduced, while also reducing the pin count of the audio processor by at least one pin per audio channel. The gradual increasing and decreasing of the interchannel delay that accomplishes these benefits is attained, according to this invention, in an automated and relatively simple manner, without requiring complex computations or logic circuitry.

It is further contemplated that various alternatives may be implemented in specific applications of this invention, such alternatives also providing these important benefits. As mentioned above, this invention may be readily applied to various interchannel delay values, applied to multiple channels in a multiple channel digital audio system. In addition, the number of steps by which the interchannel delay is gradually applied and removed can vary according to the desired spectral characteristics. It is contemplated that those skilled in the art having reference to this specification will be able to determine the particular tradeoff between performance and circuit complexity for specific applications, and that these and other alternatives to the examples described in this specification are within the scope of this invention.

Figure 16:
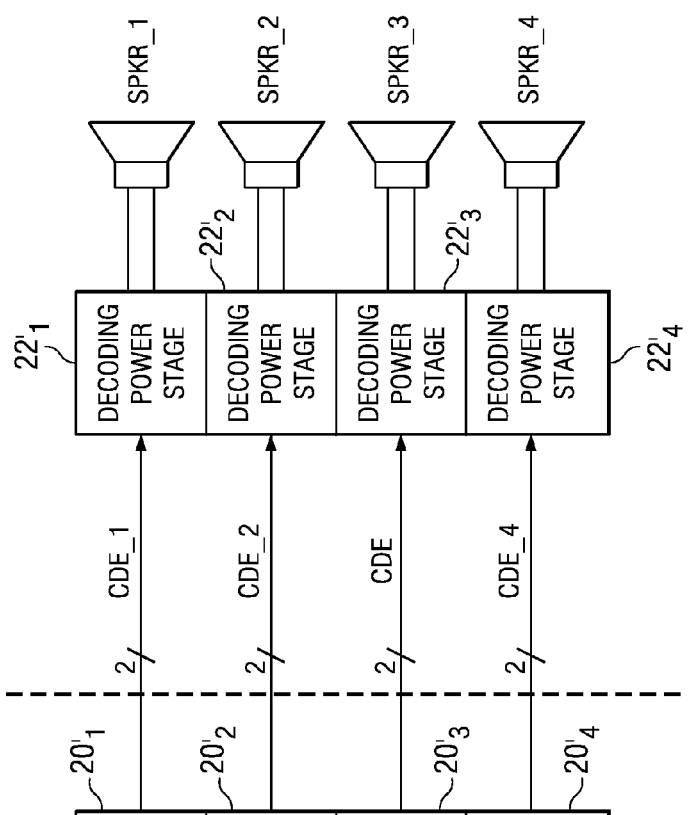
FIG. 16 is an electrical diagram, in block form, of an audio system according to an alternative preferred embodiment of the invention.
Figure 16:
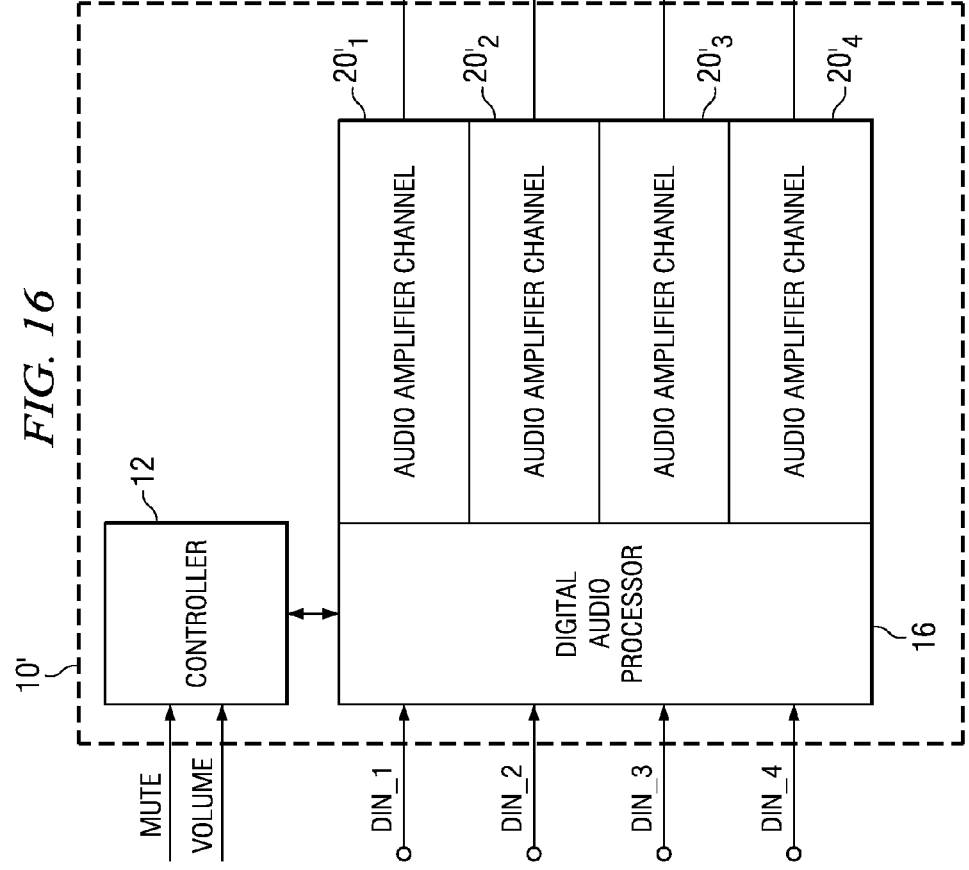
Figure 17:
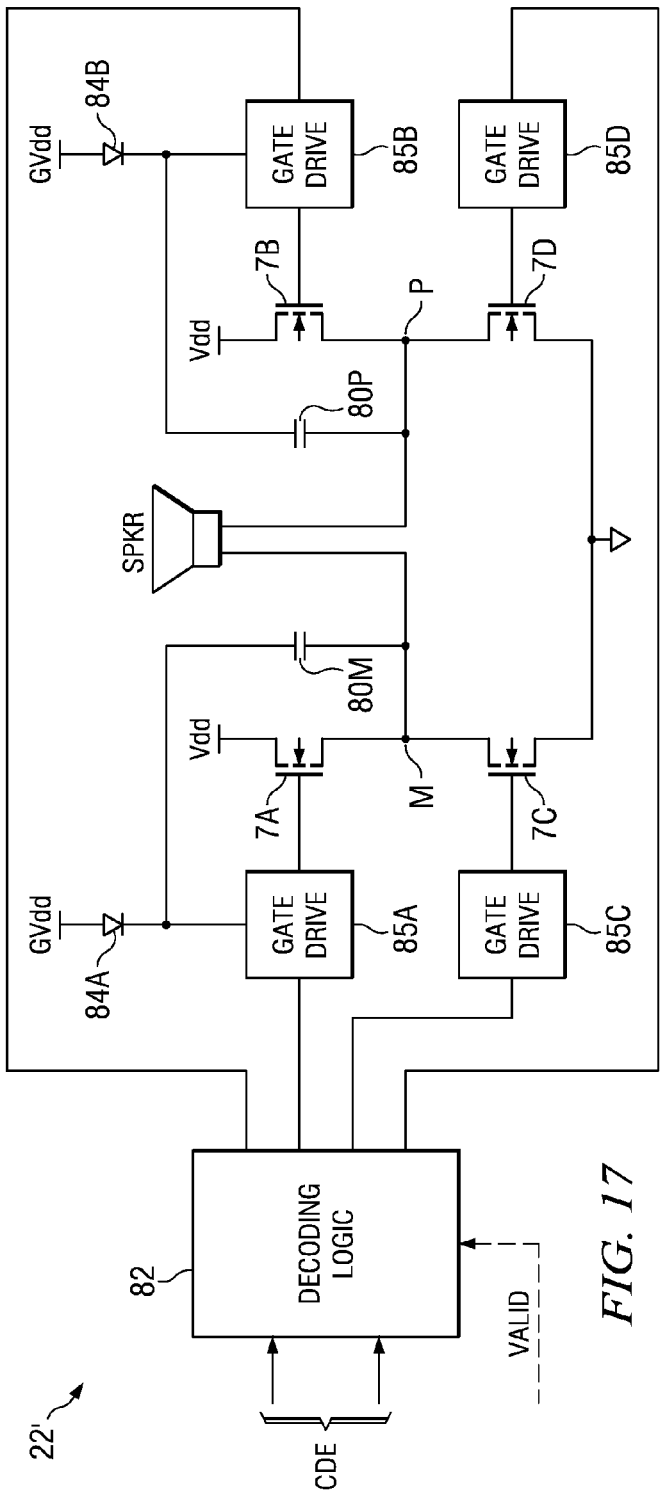
FIG. 17 is an electrical diagram, in block and schematic form, of a power stage according to this alternative preferred embodiment of the invention.

Referring now to FIG. 16, one of these alternative implementations will now be described in detail, with reference to another preferred embodiment of the invention. According to this embodiment of the invention, the output of each of channels 20' in processor 10' correspond to logic values, for example a two-bit code (i.e., having values 00, 01, 10, 11) on pairs of lines CDE_1 through CDE_4. The logic states present on lines CDE_1 through CDE_4 is decoded by logic resident in decoding power stages 22'$_1$ through 22'$_4$, respectively. The result of this decoding presents the particular drive signals applied to the output H-bridge transistors for that channel. According to this embodiment of the invention, the VALID line may not be necessary between processor 10' and decoding power stages 22'; optionally, the VALID line may participate in decoding the desired operation. FIG. 17 illustrates an example of decoding power stage 22', including decoding logic 82 and the H-bridge of transistors 7A through 7D, which are connected via LC filters (not shown, for clarity) to load SPKR in the conventional manner. According to this embodiment of the invention, the gates of each of transistors 7A through 7D are separately and individually controlled by corresponding gate drivers 85A through 85D of decoding power stage 22', in order to place the H-bridge into the desired state. The drain of each of pull-up transistors 7A, 7B is biased by power supply voltage Vdd, while gate drivers 85A, 85B for transistors 7A, 7B are each biased by a separate gate drive power supply voltage GVdd, via diodes 84A, 84B as shown. Gate drive power supply voltage GVdd remains at a steady voltage (e.g., 12 volts) to ensure that the gate dielectric of transistors 7A, 7B does not break down; conversely, power supply voltage Vdd may vary over a wider range (e.g., up to 40 volts) to effect volume control.

In addition, bootstrapping capacitor 80M is connected between the cathode of diode 84A and node M at the source of transistor 7A and the drain of transistor 7C, and bootstrapping capacitor 80P is connected between the cathode of diode 84B and node P at the source of transistor 7B and the drain of transistor 7D, in this embodiment of the invention. In operation, for example, bootstrapping capacitor 80M, is charged when node M is pulled low by transistor 7C. Upon transistor 7A turning on, the voltage at the cathode of diode 84A at gate drive 85A is then boosted above gate drive power supply voltage GVdd, which ensures rapid turn-on of gate drive 85A and fast switching of the gate of transistor 7A to a full voltage level. Bootstrapping capacitor 80P, in combination with gate drive 85B, of course operates in similar fashion. In any event, as will become apparent from the following description, it is important that bootstrapping capacitors 80P, 80M are first charged by pulling their respective nodes M, P to ground through transistors 7C, 7D, respectively, before nodes M, P are driven high in the PWM startup sequence.

According to this alternative embodiment of the invention, this encoding approach corresponds to conventional class AD operation so long as the two lines from channel 20' are complementary to one another. If these two lines carry common mode signals (i.e., both "0" or both "1"), decoding power stage 22' controls its associated transistors 7A through 7D to effect either a high-impedance operation or to enter a "bootstrapping" state in anticipation of full power operation. An example of the operation of decoding power stage 22' in this embodiment of the invention is presented in this table, in which the "on" and "off" states of transistors 7A through 7D in the H-bridge in response to various code values on line CDE are shown:

|          | 7A  | 7B  | 7C  | 7D  |
|----------|-----|-----|-----|-----|
| CDE = 00 | off | off | off | off |
| CDE = 01 | on  | off | off | on  |
| CDE = 10 | off | on  | on  | off |
| CDE = 11 | off | off | on  | on  |

As evident from this table, the traditional class AD PWM complementary stages on lines CDE result in a full differential voltage level across load SPKR, with a polarity depending on whether the value is 01 or 10. Specifically, node M between transistors 7A and 7C is at a high voltage and node P between transistors 7B and 7D is at ground for code value 01, and node M is at ground and node P is at a high voltage for code value 10.

According to this embodiment of the invention, however, the code values 00 and 11 effect special modes when applied to power stage 22', which includes decoding logic 88. A code value of 00 on lines CDE turns off all transistors 7A through 7D. This floats nodes M and P, effectively placing the H-bridge of transistors 7A through 7D in a high-impedance, or "tri-state", mode. Of course, no energy is coupled through load SPKR in this state.

Also, according to this preferred embodiment of the invention, the code value of 11 on lines CDE turn on both pull-down transistors 7C, 7D, and turn off both pull-up transistors 7A, 7B. Again, in this state, no energy is coupled through load SPKR. However, bootstrap capacitors 80M, 80P are each charged with a voltage corresponding to the difference between the power supply voltage (e.g., GVdd) at the cathode of diodes 84A, 84B, and the low node voltage (e.g., at or near ground). This charging of bootstrap capacitors 80P, 80M will assist the charging of the one of nodes M, P that is first pulled high in the next PWM cycle, in the well-known "bootstrapping" sense for n-channel MOS transistors. Briefly, for the example of transistor 7A being next turned on by a high voltage at its gate, the voltage across capacitor 80M will briefly raise the bias voltage at gate driver 85A above the voltage GVdd. During this transition, the voltage at source node P will be pulled up fully toward the power supply voltage Vdd at the drain because its gate voltage, as driven by gate driver 85A, can exceed its drain voltage by more than the device threshold voltage of transistor 7A. Accordingly, the charging of bootstrap capacitor 80M can eliminate the diode voltage drop from drain-to-source that is otherwise present in an n-channel transistor with its gate and drain nodes being biased to the same voltage. This bootstrapping thus more rapidly pulls up node M when transistor 7A is turned on, reducing the switching time of the H-bridge. The bootstrapping applied by capacitor 80P will, of course, operate in a similar fashion.

Figure 18:
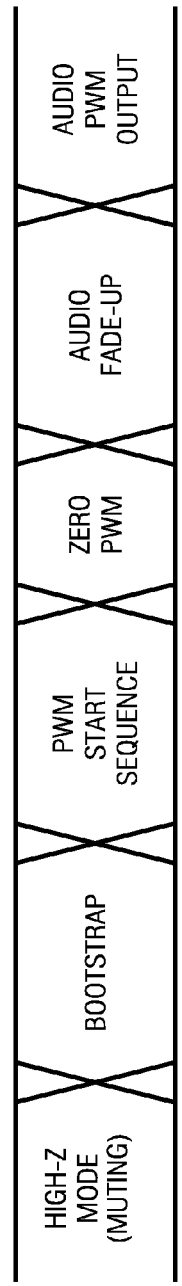
FIG. 18 is a timing diagram illustrating a startup sequence according to this alternative preferred embodiment of the invention.

According to this preferred embodiment of the invention, the bootstrapping operation described above is performed during startup or unmuting. As shown in FIG. 18, the bootstrapping function is preferably performed immediately after exiting the high-impedance (code value 11 in this example) state, and before the reduced click and pop start sequence. It has been observed that this bootstrapping operation ensures that power stage 22' avoids click and pop noise during the start sequence and subsequent power-up; if this bootstrapping were not ensured, the first "high side" turn-on command would be ignored, and the effective signal presented to load SPKR would be corrupted. Of course, during shutdown or muting, the bootstrapping sequence is not necessary (i.e., it need not follow the reduced click and pop stop sequence prior to high-Z, in the reverse of the sequence of FIG. 16).

The particular code values described in the above table have the further advantage of being applicable to conventional non-decoding power stages that do not necessarily include decoding logic. For example, conventional class AD BTL power stages will interpret the sequence of code values 11-00-11 as a pure common mode sequence, and will effect only a minimum click or pop. Single-ended power stages with a single PWM input will interpret the sequence as a low-high-low sequence, which will also have minimum clicks and pops (if the low-high-low sequence is properly timed). Accordingly, this particular arrangement according to this embodiment of the invention can be implemented in processor 10', while still providing some amount of flexibility in the selection of power stages at the output, as will now be described relative to FIGS. 19a through 19f, and FIG. 20.

Figure 19A:
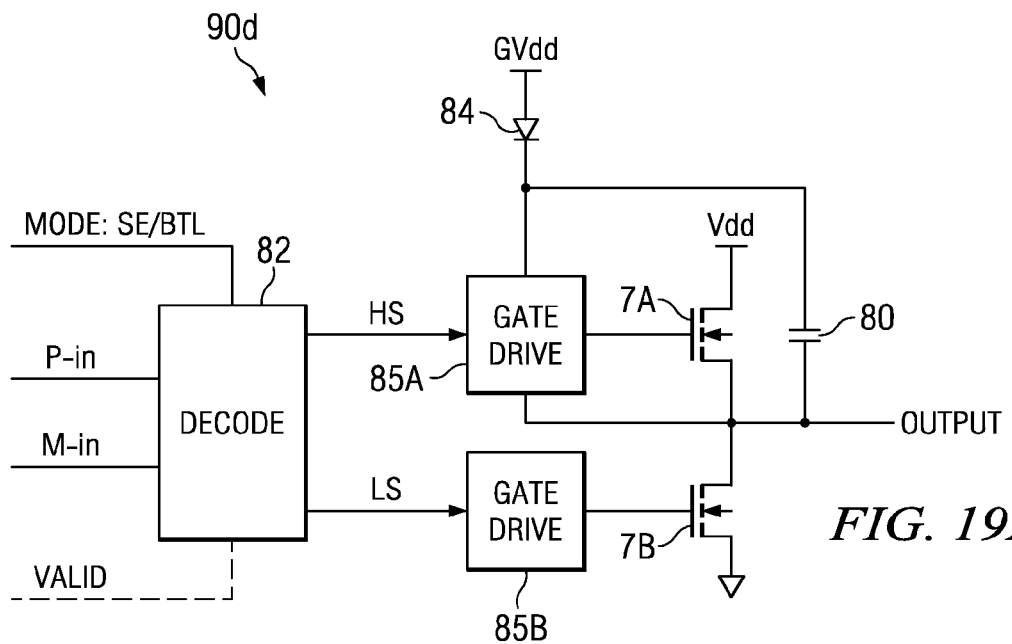
FIGS. 19a through 19f are electrical diagrams, in block and schematic form, of half-bridge circuits and output arrangements using the half-bridge circuits, according to another preferred embodiment of the invention.
Figure 19B:
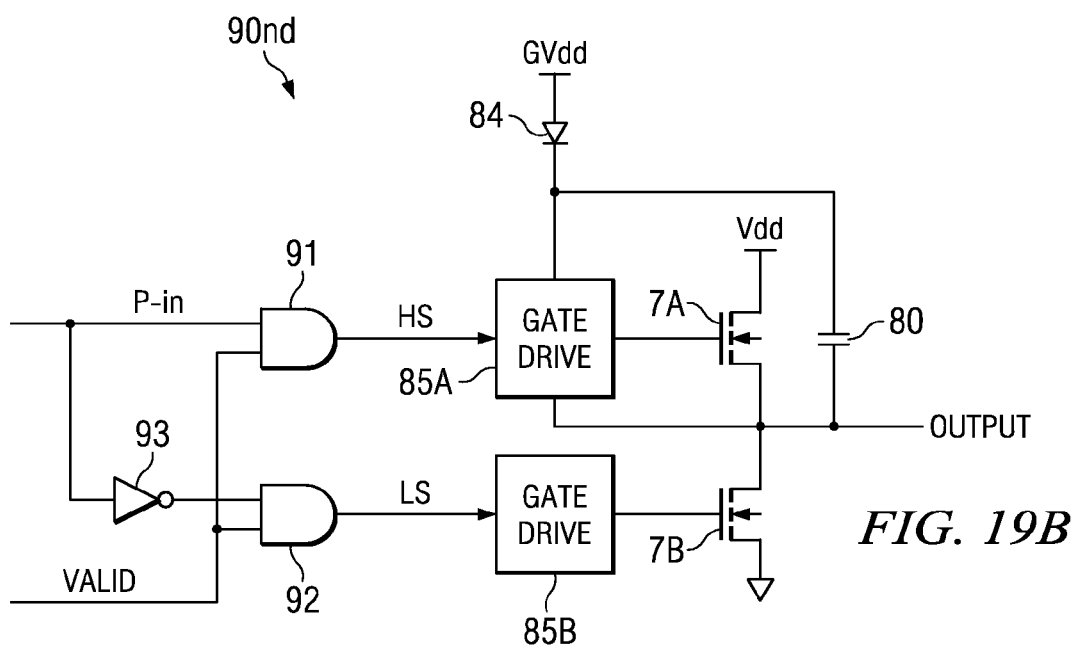

FIGS. 19a and 19b illustrate the construction of decoding half-bridge 90d and non-decoding half-bridge 90nd, as can be configured into single ended and BTL output arrangements as will be described below. As shown in FIG. 19a, and consistent with FIG. 17 described above, decoding half-bridge 90d includes decode logic 82, which receives signals on lines P-in and M-in from a corresponding processor 10, 10'. Line VALID is also optionally received by decode logic 82, as is a control line SE/BTL that communicates, for purposes of proper decoding, the output arrangement as either single-ended or BTL. Control line SE/BTL may be communicated by processor 10, 10', or may alternatively be hard-wired high or low as appropriate. In this example, decode logic 82 issues output signals HS and LS to corresponding gate drivers 85A, 85B, respectively. Gate drivers 85A, 85B drive the gates of transistors 7A, 7B as described above relative to FIG. 17; as shown in FIG. 19a, bootstrapping capacitor 80 is coupled from the output node to the cathode of diode 74. In this example, decoding logic 82 generates the appropriate signals on lines HS, LS, depending on the selected mode (SE/BTL). For single-ended operation, decoding logic 82 operates as follows:

| P-in | M-in | HS  | LS  | Note                          |
|------|------|-----|-----|-------------------------------|
| 0    | 0    | Off | Off | high impedance (mute or inactive) |
| 1    | 0    | On  | Off | High output                   |
| 0    | 1    | Off | On  | Low output                    |
| 1    | 1    | Off | Off | high impedance (mute or inactive) |

In BTL mode, decoding logic 82 operates as follows:

| P-in | M-in | HS  | LS  | Note                          |
|------|------|-----|-----|-------------------------------|
| 0    | 0    | Off | Off | high impedance (mute or inactive) |
| 1    | 0    | On  | Off | High output                   |
| 0    | 1    | Off | On  | Low output                    |
| 1    | 1    | Off | On  | Bootstrap charge              |

In non-decoding half-bridge 90nd as shown in FIG. 19a, line P-in is received at an input of AND gate 91, and at an input of AND gate 92 via inverter 93. Each of AND gates 91, 92 also receive line VALID at another input, and drive lines HS, LS at their respective outputs. As such, line VALID gates the communication of the signal on line P-in to gate drivers 85A, 85B. Gate drivers 85A, 85B drive the gates of transistors 7A, 7B in non-decoding half-bridge 90nd similarly as in the case of decoding half-bridge 90d; bootstrapping capacitor 80 is similarly included.

Figure 19C:
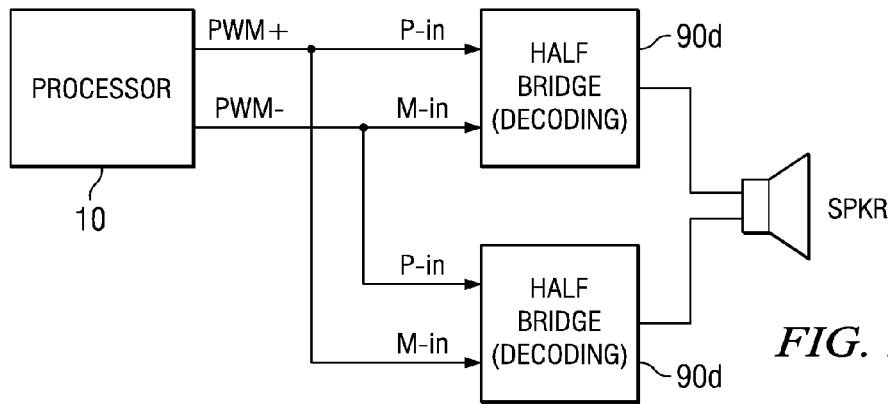

Referring now to FIGS. 19c through 19f, various output arrangements of processor 10 in combination with half-bridges 90d, 90nd in single-ended and BTL arrangements will now be described in detail. FIG. 19c illustrates decoding half-bridges 90d in communication with processor 10, corresponding to the arrangement described above relative to FIGS. 3, 16, and 17. As shown in FIG. 19c, processor 10 issues signals on lines PWM+, PWM− (and, optionally, line VALID) to inputs P-in, M-in, respectively, of one decoding half-bridge 90d. Another decoding half-bridge 90d also receives lines PWM+, PWM−, but at its inputs M-in, P-in, respectively; this reversal results in complementary outputs from this pair of decoding half-bridges 90d, which drives load SPKR in class AD BTL mode.

Figure 19D:
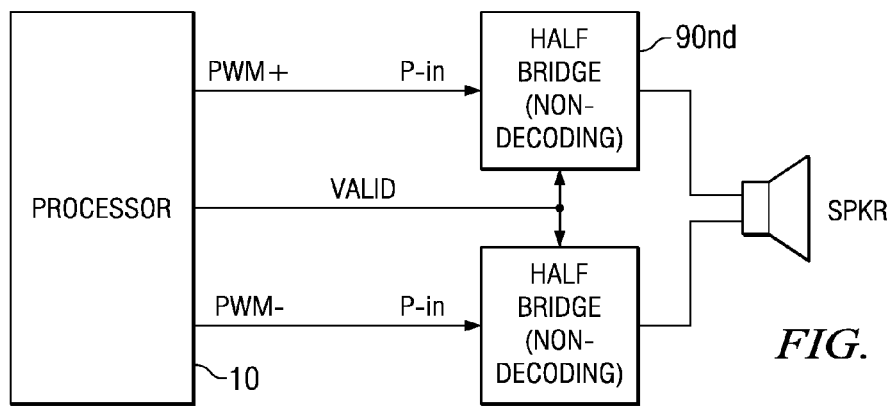

FIG. 19d illustrates a BTL arrangement in which non-decoding half-bridges 90nd are used. In this case, processor 10 drives line PWM+, which is connected to the P-in input of one non-decoding half-bridge 90nd, and line PWM−, which is connected to the P-in input of another non-decoding half-bridge 90nd. Both of non-decoding half-bridges 90nd receive the signal on line VALID, and their outputs are applied to opposing sides of load SPKR in BTL form. Because lines PWM+, PWM− are complementary to one another as driven by processor 10 (during normal operation, after the start sequence), non-decoding half-bridges 90nd drive complementary signals to the opposing sides of load SPKR.

Figure 19E:
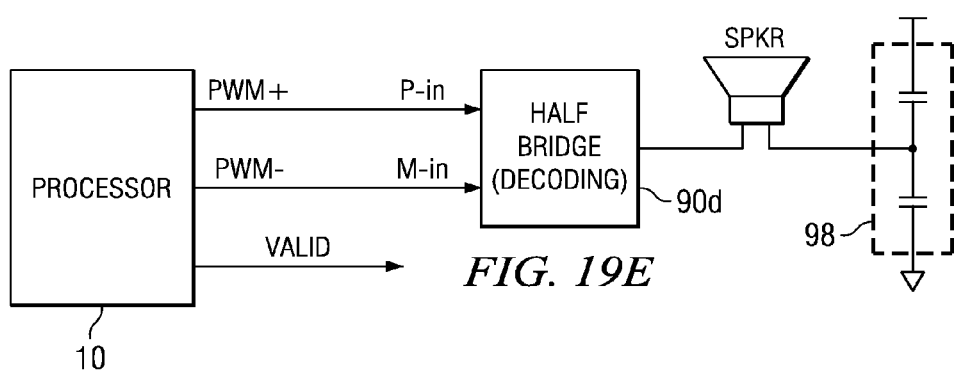
Figure 19F:
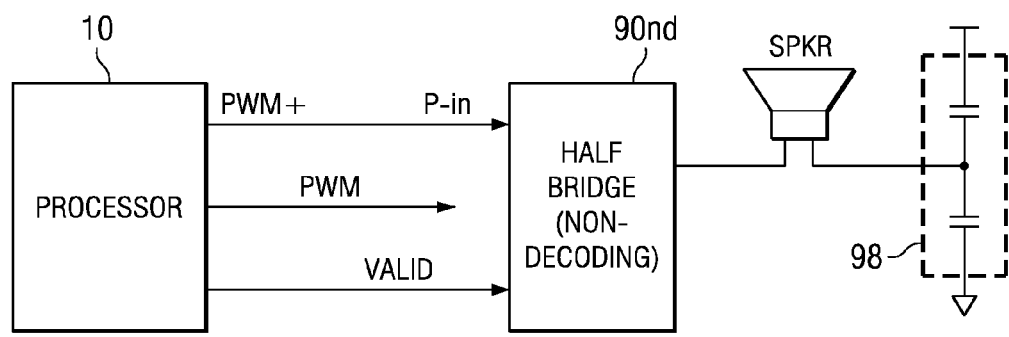

FIGS. 19e and 19f illustrate single-ended output implementation examples. In the decoding power stage arrangement of FIG. 19e, line PWM+ from processor 10 is applied to input P-in of decoding half-bridge 90d, and line PWM− from processor 10 is applied to input M-in of decoding half-bridge 90d. The output of half-bridge 90d drives one side of load SPKR, the other side of which is connected to capacitor voltage divider 98 between a power supply voltage and ground. The capacitors of voltage divider 98 block DC current from passing through load SPKR. As will be apparent to those skilled in the art, the node of voltage divider 98 connected to load SPKR is preferably pre-charged to Vdd/2 with a bias circuit (not shown for clarity) to match the operating mean voltage of the output of half-bridge 90d, which is Vdd/2 in the 50% duty cycle, idle, condition. If voltage divider 98 is not pre-charged in this manner, it would be effectively charged through load SPKR during the startup sequence, which would result in an audible transient signal through load SPKR. In the non-decoding arrangement of FIG. 19f, output PWM+ from processor 10 is applied to the P-in input of non-decoding half-bridge 90nd, as is line VALID; non-decoding half-bridge 90nd drives one side of load SPKR, which has capacitor voltage divider 98 at its other side.

Figure 20:
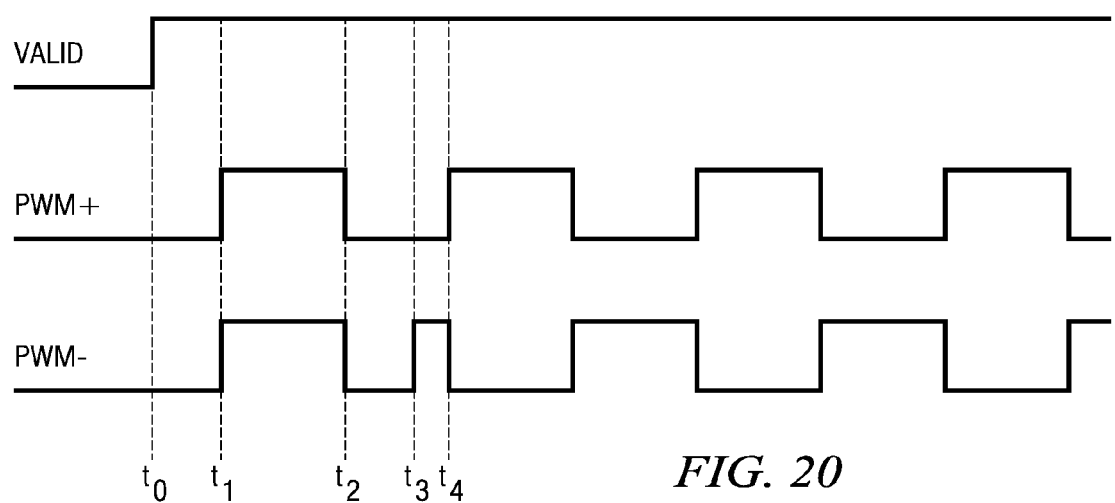
FIG. 20 is a timing diagram illustrating the operation of encoded PWM signals in effecting a startup sequence, according to this preferred embodiment of the invention.

FIG. 20 illustrates a startup (from muting or on power-up) sequence of the code values from processor 10, 10' according to the preferred embodiment of the invention. According to this example, charging of the bootstrapping capacitors 80 is ensured for each of the power stage implementations of FIGS. 19c through 19f, including both BTL and single-ended outputs, and for both power stages that have decoding logic and those that do not. FIG. 20 illustrates the timing of the signals on line VALID, and on lines PWM+ and PWM−. When applied to decoding power stages, such as in the arrangements of FIGS. 19c and 19e, the code value on lines PWM+, PWM− are applied to the P-in and M-in inputs of decoding half-bridges 90d; conversely, when applied to non-decoding power stages, such as in the arrangements of FIGS. 19d and 19f, lines PWM+, PWM− directly present the pulse-width-modulated signals according to which the power transistors 7 are driven, for example as shown in FIG. 19b.

In operation, for the example of the BTL arrangement using decoding half-bridges 90d as shown in FIG. 19c, prior to time $t_0$, line VALID is inactive, and lines PWM+, PWM− are both low. Because of the BTL control signal, both of decoding half-bridges 90d are disabled in this event. Line VALID is driven active at time $t_0$ at which time lines PWM+, PWM− both remain low, corresponding to a code value of 00. As evident from the table discussed above, this state maintains both of transistors 7A and 7B in both of decoding half-bridges 90d off. No energy is driven through load SPKR. At time $t_1$, the bootstrapping operation is effected by both of lines PWM+, PWM− going active high. Decoding half-bridges 90d both respond to this code value 11 by turning on their respective transistors 7B. As described above, this causes bootstrapping capacitor 80 in each of decoding half-bridge 90d to charge. The charging of bootstrapping capacitors 80 is effective, and symmetric relative to one another, because neither of transistors 7A in decoding half-bridges 90d have yet been turned on in this startup sequence. At time $t_2$ in this example, both of lines PWM+, PWM− are taken low to stop the bootstrapping operation, following which, at time $t_3$, the special reduced click and pop start sequence begins. From time $t_3$ forward, lines PWM+, PWM− are complementary to one another. As described above, the gradual application of interchannel delay is applied after the first few edges on lines PWM+, PWM−.

As mentioned above, this same code sequence as shown in FIG. 20 is operable for non-decoding half-bridges 90nd, for example the arrangement shown in FIG. 19d for a BTL output arrangement. As shown in this Figure, line PWM+ drives input P-in of one non-decoding half-bridge 90nd, while line PWM− drives input P-in of another non-decoding half-bridge 90nd. In this arrangement, with reference to FIG. 20, at time $t_0$, line VALID is driven active while both of lines PWM+, PWM− remain low. This low level causes transistor 7B in both of non-decoding half-bridges 90nd to both be turned on, which charges bootstrapping capacitor 80 in each circuit as described above. The subsequent cycling of lines PWM+, PWM− at time $t_1$ through time $t_3$ then alternately turn on transistors 7A, 7B, but at all times resulting in common mode signals across load SPKR. As such, no energy is coupled through load SPKR. The reduced click and pop sequence then begins as described above beginning at time $t_3$, with complementary class AD operation following from time $t_3$ and onward. Accordingly, the proper bootstrapping sequence is also effected, by this sequence of code values (or, in this case, PWM signals) even for the arrangement of FIG. 19d that does not include decoding logic.

In addition, this code value startup sequence is also effective in single-ended output arrangements, as shown in FIGS. 19e and 19f. In the arrangement of FIG. 19e, decoding half-bridge 90d drives load SPKR from only one side, and the SE/BTL control signal indicates that decoding logic 82 is to following the single-ended logic table described above. In this case, because both of code values 11 and 00 are decoded as high-impedance (both of transistors 7A and 7B are turned off by lines HS and LS both driven low for these code values), decoding half-bridge 90d remains in this high-impedance state until time $t_3$ of FIG. 20. Between time $t_3$ and $t_4$ in this sequence, bootstrapping capacitor 80M is then charged, because line HS is low and line LS is high in response to code value 01 during this time, turning on transistor 7B and turning off transistor 7A. The constraint of the first active pulse being a low pulse (01) is necessary to effect bootstrapping, because there is no signal-neutral way of charging bootstrap capacitor 80 in this single-ended configuration, as opposed to the BTL arrangement in which the bootstrapping operation can be performed by the signal-neutral state of both half-bridges 90d turning on their low-side transistors 7B in response to code value 11. The remainder of the sequence effects the appropriate operation, after bootstrapping, as evident from the above description.

In the single-ended configuration using non-decoding half-bridge 90nd, as shown in FIG. 19f, the same startup sequence of levels on lines PWM+ is applied as described above relative to FIG. 20. The low level on line PWM+ following time $t_0$ and before time $t_1$ turns on transistor 7B before transistor 7A is turned on, in this startup sequence. As such, bootstrapping transistor 80 in non-decoding half-bridge 90nd is properly charged, even in this single-ended and non-decoding case. In this arrangement, the PWM$_{13}$ signal, beginning from time t$_0$, is reproduced, by half-bridge 90nd, as a low-high-low sequence prior to time t$_3$, at which the reduced click and pop start sequence begins. This low-high-low sequence will add audible noise, but this added click and pop can be minimized by properly selecting the timing of the low-high-low sequence.

It has been found, according to this invention, that this added click and pop is minimized by setting the duration of the time period between time t$_0$ and time t$_1$ to equal the duration between time t$_2$ and time t$_3$ (that is: t$_1$−t$_0$=t$_3$−t$_2$), and by setting the duration of the time period between time t$_1$ and time t$_2$ to twice the duration between time t$_0$ and time t$_1$ (that is: t$_2$−t$_1$=2*(t$_1$−t$_0$)). It has been observed that these conditions result in substantially a neutral signal across load SPKR in audible frequencies (i.e., its spectrum has low energy in the audible band). This sequence between time t$_0$ and time t$_3$, in combination with the previously described low click and pop start sequence beginning at time t$_3$, will thus result in relatively low audible click and pop energy. This sequencing of the low-high-low active signals between time t$_0$ and time t$_3$, for the non-decoding single-ended configuration, can be evaluated according to the theory of operation described above for calculating the glue sequence, relative to equations (10) and (11). It is therefore contemplated that other attractive optimizations of this sequence can be identified by those skilled in the art having reference to this specification.

According to this preferred embodiment of the invention, therefore, the same startup sequence can be generated by processor 10', and applied to a wide range of power stage arrangements, while still ensuring both proper charging of bootstrap capacitors and also the proper reduced click and pop start sequence. To the extent that high-impedance disabling is not applied by the non-decoding power stages 22, 22se, the gate drive signals are either in common mode (BTL) or apply pulses that do not couple a great deal of audible energy through load SPKR.

Also according to this embodiment of the invention, individual channels 20 can be disabled (i.e., to a high-impedance state) by their corresponding inputs PWM+, PWM_, even in systems in which all of the power stages receive an active level on a global line VALID.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A digital audio system, comprising:
    a plurality of power stage devices, each having an input for receiving pulse-width-modulated signals, and having an output for driving a speaker responsive to the pulse-width-modulated signals; and
    an audio processor, comprising:
    circuitry for generating a start sequence of pulse-width-modulated signals for the associated power stage device at a transition from a muted state, and for generating a stop sequence of pulse-width-modulated signals for the associated power stage device at a transition from a muted state; and
    a plurality of audio amplifier channels, each associated with a power stage device and comprising:
    PWM circuitry for generating pulse-width-modulated signals for the associated power stage device, responsive to a digital audio input signal;
    interchannel delay circuitry, for receiving an interchannel delay value, and coupled to the PWM circuitry for applying a delay to edges of the pulse-width-modulated signals responsive to the interchannel delay value; and
    delay adjust circuitry, for increasing the delay of the edges of the pulse-width-modulated signals following the start sequence to increase over a plurality of edges from zero interchannel delay to a full interchannel delay corresponding to the interchannel delay value, and for decreasing the delay of the edges of the pulse-width-modulated signals following the stop sequence to decrease over a plurality of edges from the full interchannel delay to zero interchannel delay.

2. The system of claim 1, wherein each of the plurality of power stage devices also have a control input for receiving a valid signal;
    and wherein the audio processor further comprises:
    control circuitry, for presenting a valid signal from a single terminal to the control inputs of the plurality of power stage devices.

3. The system of claim 1, wherein each of the plurality of power stage devices comprise:
    decoding logic, for decoding a digital code communicated by the pulse-width-modulated signals from the PWM circuitry; and
    a plurality of output transistors, each having a conduction path coupled between a voltage and an output node, and having a control terminal receiving a signal from the decoding logic.

4. The system of claim 3, wherein the plurality of output transistors comprise:
    a first transistor, having its conduction path coupled between a power supply voltage and a first output node;
    a second transistor, having its conduction path coupled between the first output node and a reference voltage;
    a third transistor, having its conduction path coupled between the power supply voltage and a second output node; and
    a fourth transistor, having its conduction path coupled between the second output node and the reference voltage;
    wherein the first and second output nodes are for coupling to opposite sides of the speaker.

5. The system of claim 4, wherein the PWM circuitry generates a two-bit output code;
    wherein each of the plurality of output stages further comprises first and second bootstrapping capacitors coupled to the power supply voltage and to the first and third transistors, respectively;
    wherein the decoding logic turns on the first and fourth transistors and turns off the second and third transistors responsive to a first value of the output code;
    wherein the decoding logic turns on the second and third transistors and turns off the first and fourth transistors responsive to a second value of the output code;
    wherein the decoding logic turns off the first, second, third, and fourth transistors responsive to a third value of the output code;
    and wherein the decoding logic turns on the second and fourth transistors responsive to a fourth value of the output code.

6. The system of claim 1, wherein each of the audio amplifier channels further comprise:
a digital interpolation function, for receiving a pulse-code-modulated signal corresponding to the digital audio input signal for the channel, and for generating an oversampled digital signal responsive to the pulse-code-modulated signal.

7. The system of claim 6, wherein each of the audio amplifier channels further comprise:
a noise-shaping and digital non-linear correction function, for filtering the oversampled digital signal and applying a filtered digital audio signal to the PWM circuitry.

8. The system of claim 7, wherein the PWM circuitry comprises:
edge calculation circuitry for calculating rising and falling edges of the pulse-width-modulated signals responsive to the filtered digital audio signal;
a frame counter, for counting cycles of a high-speed clock signal within a pulse-width-modulated frame;
logic circuitry, for generating the pulse-width-modulated signals responsive to a comparison of the calculated rising and falling edges to the contents of the frame counter.

9. The system of claim 8, wherein the interchannel delay circuitry comprises:
circuitry for generating at least one delimiter signal corresponding to a location within the pulse-width-modulated frame, responsive to a frame synchronization signal and the interchannel delay value;
wherein the contents of the frame counter of the PWM circuitry is reset responsive to the delimiter signal.

10. The system of claim 9, wherein the delay adjust circuitry comprises:
scaling circuitry, having an input receiving the interchannel delay value, for generating a sequence of at least one fractional value of the interchannel delay value between zero delay and the full interchannel delay;
and wherein the generating circuitry of the interchannel delay circuitry generates the at least one delimiter signal responsive to the sequence of at least one fractional value of the interchannel delay value.

11. The system of claim 10, wherein the at least one delimiter signal includes a start delimiter and a mid-frame delimiter.

12. The system of claim 1, wherein the delay adjust circuitry increases the delay of the edges of the pulse-width-modulated signals from zero interchannel delay to one intermediate delay value to the full interchannel delay, over successive edges.

13. The system of claim 12, wherein the delay adjust circuitry increases the delay of the edges of the pulse-width-modulated signals from zero interchannel delay to a plurality of intermediate delay values to the full interchannel delay, over successive edges.

14. The system of claim 1, wherein the full interchannel delay is a negative delay.

15. The system of claim 1, wherein the full interchannel delay is a positive delay.

16. The system of claim 1, wherein different ones of the plurality of audio amplifier channels have different interchannel delay values relative to one another.

17. The system of claim 1, wherein the PWM circuitry comprises:
edge calculation circuitry for calculating rising and falling edges of the pulse-width-modulated signals responsive to the digital audio input signal;
a frame counter, for counting cycles of a high-speed clock signal within a pulse-width-modulated frame;
logic circuitry, for generating the pulse-width-modulated signals responsive to a comparison of the calculated rising and falling edges to the contents of the frame counter.

18. The system of claim 17, wherein the interchannel delay circuitry comprises:
circuitry for generating at least one delimiter signal corresponding to a location within the pulse-width-modulated frame, responsive to a frame synchronization signal and the interchannel delay value;
wherein the contents of the frame counter of the PWM circuitry is reset responsive to the delimiter signal.

19. The system of claim 18, wherein the delay adjust circuitry comprises:
scaling circuitry, having an input receiving the interchannel delay value, for generating a sequence of at least one fractional value of the interchannel delay value between zero delay and the full interchannel delay;
and wherein the generating circuitry of the interchannel delay circuitry generates the at least one delimiter signal responsive to the sequence of at least one fractional value of the interchannel delay value.

20. The system of claim 19, wherein the at least one delimiter signal includes a start delimiter and a mid-frame delimiter.

21. An audio processor, comprising:
digital audio processing circuitry, for receiving a plurality of digital signals, and for processing these plurality of digital signals into a plurality of digital audio input signals for each of a plurality of speaker channels;
circuitry for generating a start sequence of pulse-width-modulated signals for the associated power stage device at a transition from a muted state, and for generating a stop sequence of pulse-width-modulated signals for the associated power stage device at a transition from a muted state; and
a plurality of audio amplifier channels, each comprising:
PWM circuitry for generating pulse-width-modulated signals for the associated power stage device, responsive to one of the plurality of digital audio input signals;
interchannel delay circuitry, for receiving an interchannel delay value, and coupled to the PWM circuitry for applying a delay to edges of the pulse-width-modulated signals responsive to the interchannel delay value; and
delay adjust circuitry, for increasing the delay of the edges of the pulse-width-modulated signals following the start sequence to increase over a plurality of edges from zero interchannel delay to a full interchannel delay corresponding to the interchannel delay value, and for decreasing the delay of the edges of the pulse-width-modulated signals following the stop sequence to decrease over a plurality of edges from the full interchannel delay to zero interchannel delay.

22. The audio processor of claim 21, further comprising:
control circuitry, for presenting a valid signal at a single terminal.

23. The audio processor of claim 21, wherein each of the audio amplifier channels further comprise:
a digital interpolation function, for receiving a pulse-code-modulated signal corresponding to the digital audio input signal for the channel, and for generating an oversampled digital signal responsive to the pulse-code-modulated signal.

24. The audio processor of claim 23, wherein each of the audio amplifier channels further comprise:

a noise-shaping and digital non-linear correction function, for filtering the oversampled digital signal and applying a filtered digital audio signal to the PWM circuitry.

25. The audio processor of claim 21, wherein the delay adjust circuitry increases the delay of the edges of the pulse-width-modulated signals from zero interchannel delay to one intermediate delay value to the full interchannel delay, over successive edges.

26. The audio processor of claim 25, wherein the delay adjust circuitry increases the delay of the edges of the pulse-width-modulated signals from zero interchannel delay to a plurality of intermediate delay values to the full interchannel delay, over successive edges.

27. The audio processor of claim 21, wherein the full interchannel delay is a negative delay.

28. The audio processor of claim 21, wherein the full interchannel delay is a positive delay.

29. The audio processor of claim 21, wherein different ones of the plurality of audio amplifier channels have different interchannel delay values relative to one another.

30. The audio processor of claim 21, wherein the PWM circuitry comprises:
   edge calculation circuitry for calculating rising and falling edges of the pulse-width-modulated signals responsive to the digital audio input signal;
   a frame counter, for counting cycles of a high-speed clock signal within a pulse-width-modulated frame;
   logic circuitry, for generating the pulse-width-modulated signals responsive to a comparison of the calculated rising and falling edges to the contents of the frame counter.

31. The audio processor of claim 30, wherein the interchannel delay circuitry comprises:
   circuitry for generating at least one delimiter signal corresponding to a location within the pulse-width-modulated frame, responsive to a frame synchronization signal and the interchannel delay value;
   wherein the contents of the frame counter of the PWM circuitry is reset responsive to the delimiter signal.

32. The audio processor of claim 31, wherein the delay adjust circuitry comprises:
   scaling circuitry, having an input receiving the interchannel delay value, for generating a sequence of at least one fractional value of the interchannel delay value between zero delay and the full interchannel delay;
   and wherein the generating circuitry of the interchannel delay circuitry generates the at least one delimiter signal responsive to the sequence of at least one fractional value of the interchannel delay value.

33. The audio processor of claim 32, wherein the at least one delimiter signal includes a start delimiter and a mid-frame delimiter.

* * * * *